US006934649B2

(12) United States Patent
Ageishi et al.

(10) Patent No.: US 6,934,649 B2
(45) Date of Patent: Aug. 23, 2005

(54) WAVEFORM DETECTION SYSTEM AND STATE-MONITORING SYSTEM

(75) Inventors: Youichi Ageishi, Tokyo (JP); Tetsuyuki Wada, Tokyo (JP)

(73) Assignee: Synchro Kabushiki Kaisha, Tokyo (JP)

( * ) Notice: Subject to any disclaimer, the term of this patent is extended or adjusted under 35 U.S.C. 154(b) by 86 days.

(21) Appl. No.: 10/467,634

(22) PCT Filed: May 15, 2001

(86) PCT No.: PCT/JP01/04019

§ 371 (c)(1),
(2), (4) Date: Aug. 11, 2003

(87) PCT Pub. No.: WO02/093181

PCT Pub. Date: Nov. 21, 2002

(65) Prior Publication Data

US 2004/0059760 A1 Mar. 25, 2004

(51) Int. Cl.$^7$ .............................................. G06F 19/00
(52) U.S. Cl. ............................ 702/70; 702/73; 702/66; 708/317; 704/265; 700/94; 324/76.28
(58) Field of Search ............................... 702/66, 70–71, 702/73; 708/317; 704/265; 700/94; 375/251; 324/76.28

(56) References Cited

U.S. PATENT DOCUMENTS

| 4,189,701 A | * | 2/1980 | Torok et al. | 367/2 |
| 4,552,154 A | * | 11/1985 | Hartlaub | 600/515 |
| 5,803,911 A | * | 9/1998 | Inukai et al. | 600/387 |
| 2003/0076165 A1 | * | 4/2003 | Furman et al. | 329/304 |

FOREIGN PATENT DOCUMENTS

JP  10-260066 A1  9/1998

OTHER PUBLICATIONS

Padgett et al., 'Pulse Coupled Neural Networks (PCNN), Wavelets and Radial Basis Functions: Olfactory Sensor Applications'), 1998, IEEE Article, pp. 1784–1789.*
Kinsner et al., 'Speech and Image Signal Compression with Wavelets', 1993, IEEE Article, pp. 368–375.*
Lee et al., 'Estimation of Evoked Potentials Based on the Wavelet Analysis', Nov. 2, 1997, IEEE Article, pp. 1464–1467.*
Caughey et al., 'Wavelet Analysis of Breaking Wave Data', 1993, IEEE Article, pp. 189–192.*
International Search Report.
Agu et al., System Control Information vol. 41, No. 6, pp. 201–207 (1997).

* cited by examiner

Primary Examiner—Marc S. Hoff
Assistant Examiner—Elias Desta
(74) Attorney, Agent, or Firm—Rader, Fishman & Grauer PLLC

(57) ABSTRACT

The present invention provides a waveform detection system and a state-monitoring system. The waveform detection system features a signal-processing function that characterizes and detects non-cyclic transient variations and performs 1/f fluctuation conversion for input waveforms to derive output waveforms. The waveform detection system characterizes signs of state variation, incorporates multiple digital filters in the digital filter calculator of the computer, uses coefficient patterns derived from non-integer n-time integration as elemental patterns for multiplication coefficient patterns, and incorporates a manner of changing the phase of at least one of the elemental patterns, input signal data, and digital filter output so that the outputs of digital filters that use the elemental patterns are synthesized in a state where a portion of the phases of the characteristic extracting and processing function is changed. The state-monitoring system of the present invention monitors states based on the signal processing of the waveform detection system.

11 Claims, 46 Drawing Sheets

*a Phase-matching parameter

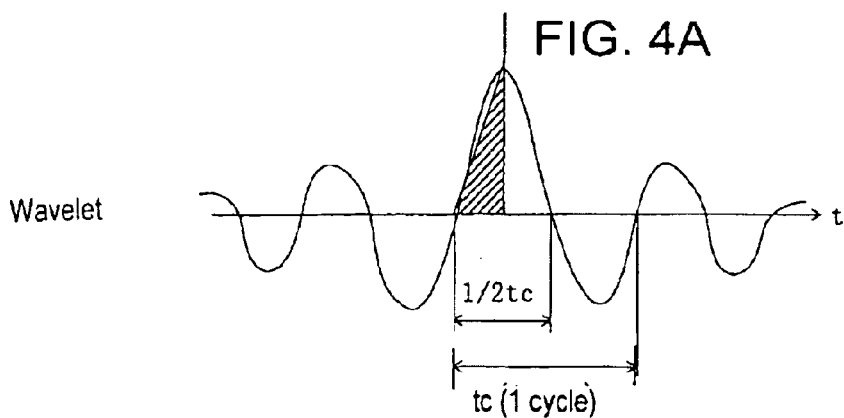
FIG. 4A Wavelet
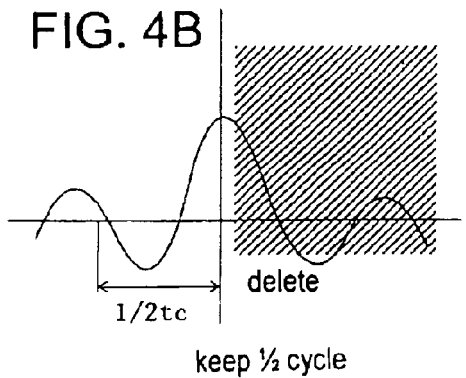
FIG. 4B keep ½ cycle
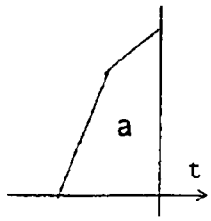
FIG. 4E-1
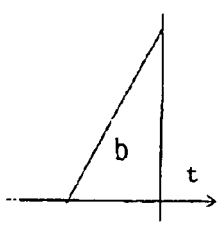
FIG. 4E-2
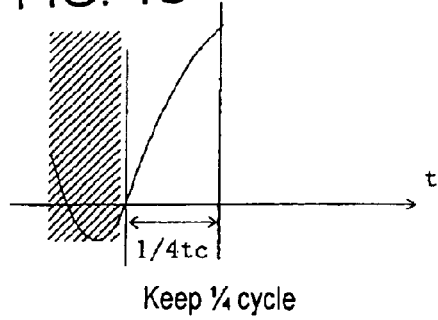
FIG. 4C Keep ¼ cycle
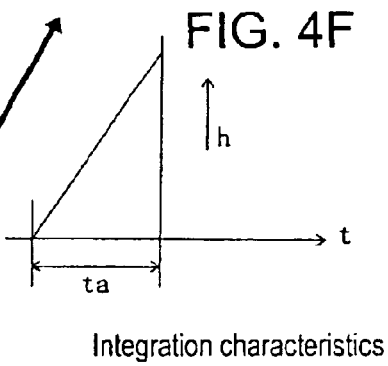
FIG. 4F Integration characteristics
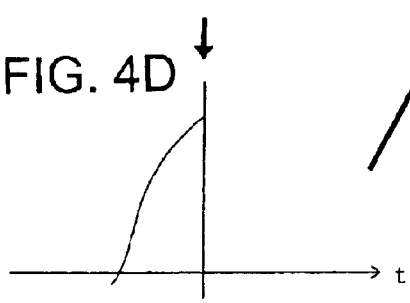
FIG. 4D
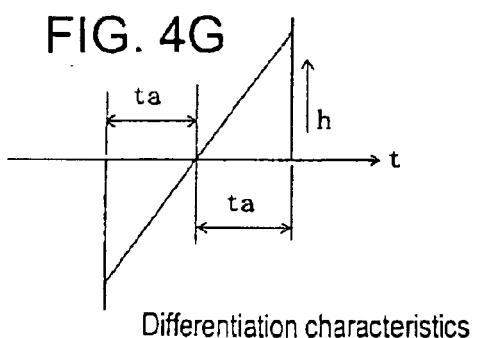
FIG. 4G Differentiation characteristics

FIG. 5
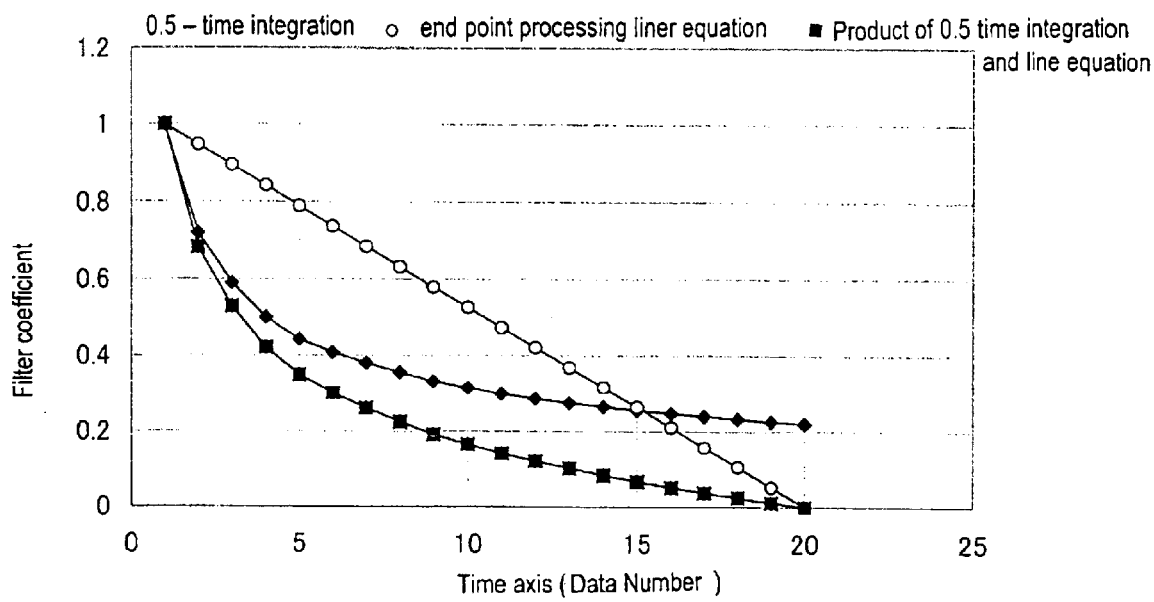
Filter configuration method (progression calculation method in expressions)
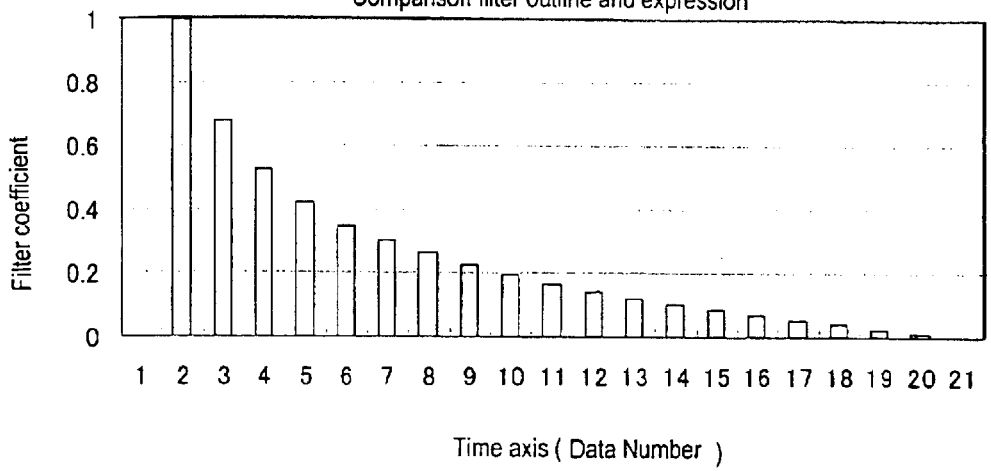

Number of taps

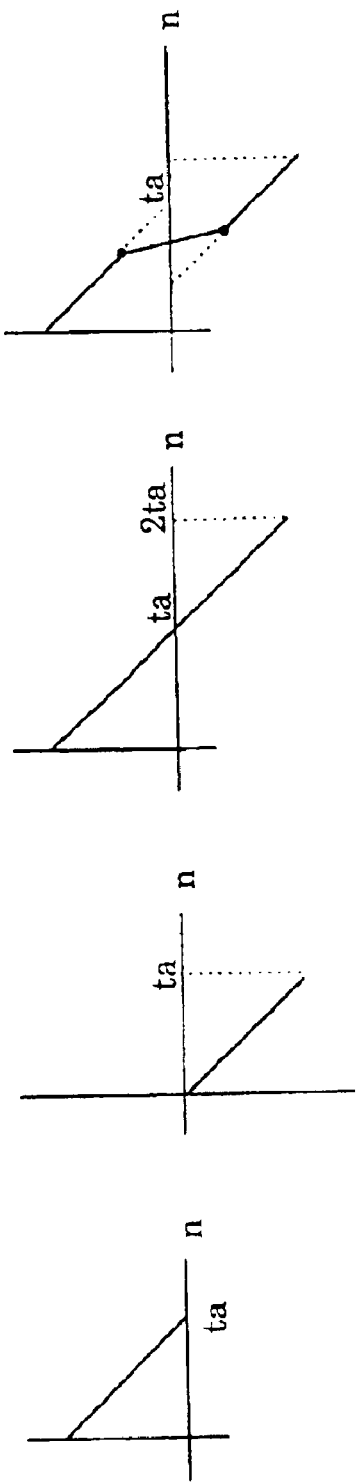

(b)

Integration P-1

Differentiation P

FIG. 26
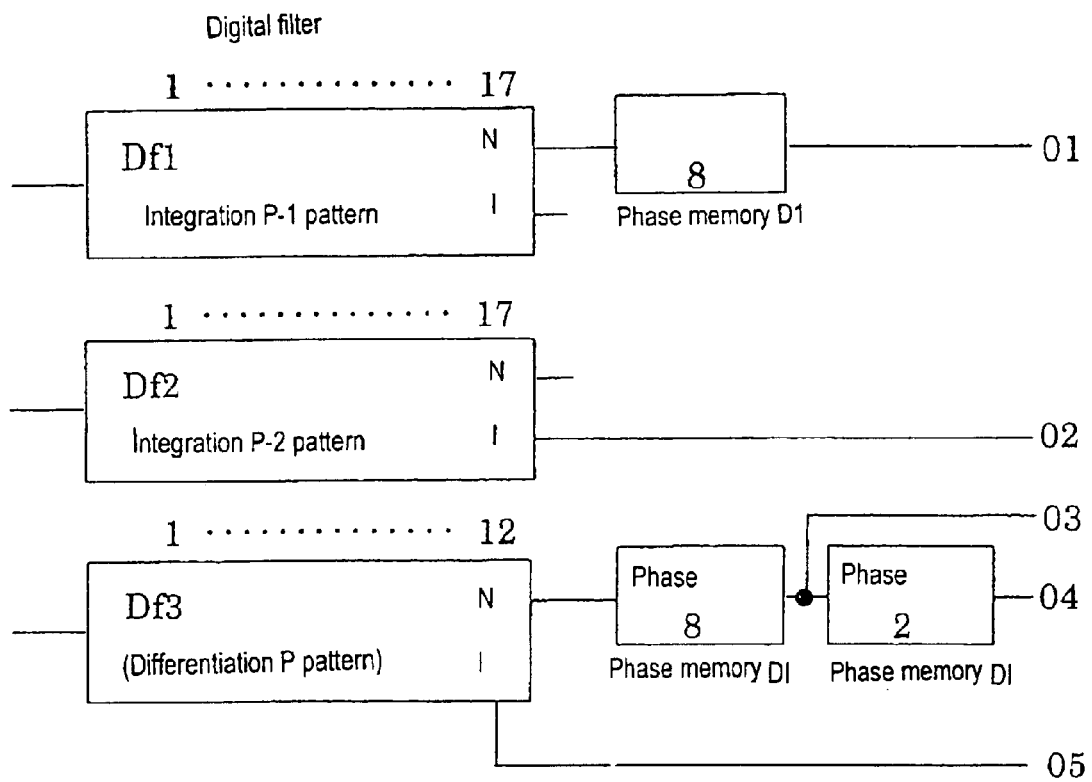
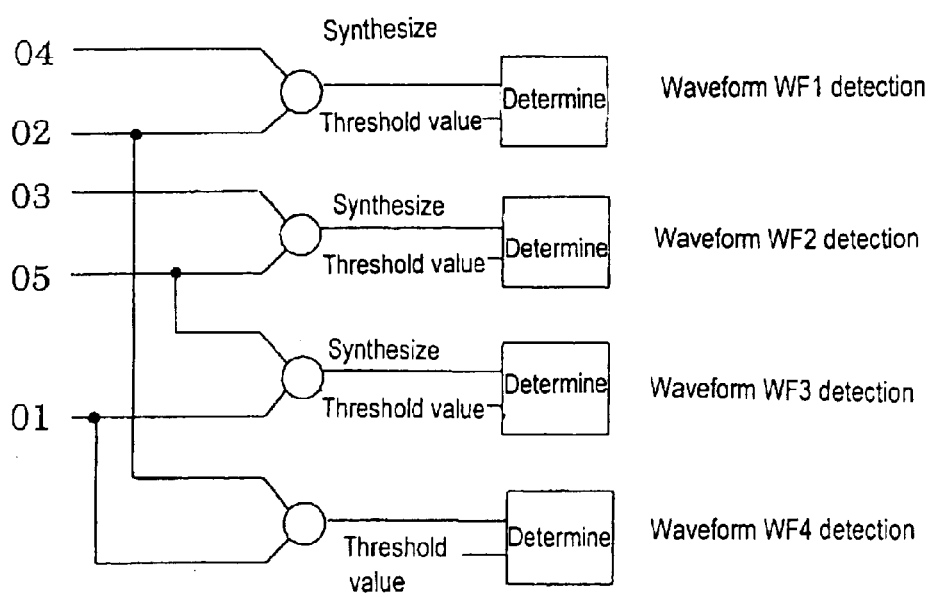

Example of delay of detection due to different multiplication
FIG. 29A (A) conventional multiplication coefficient pattern
FIG. 29B (B) multiplication coefficient pattern of the present invention
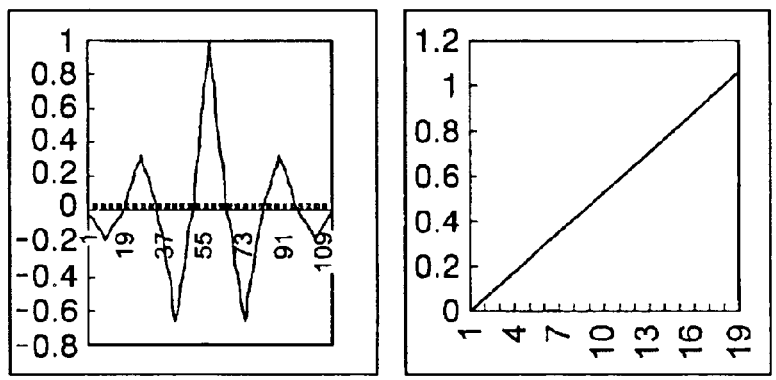
FIG. 29C
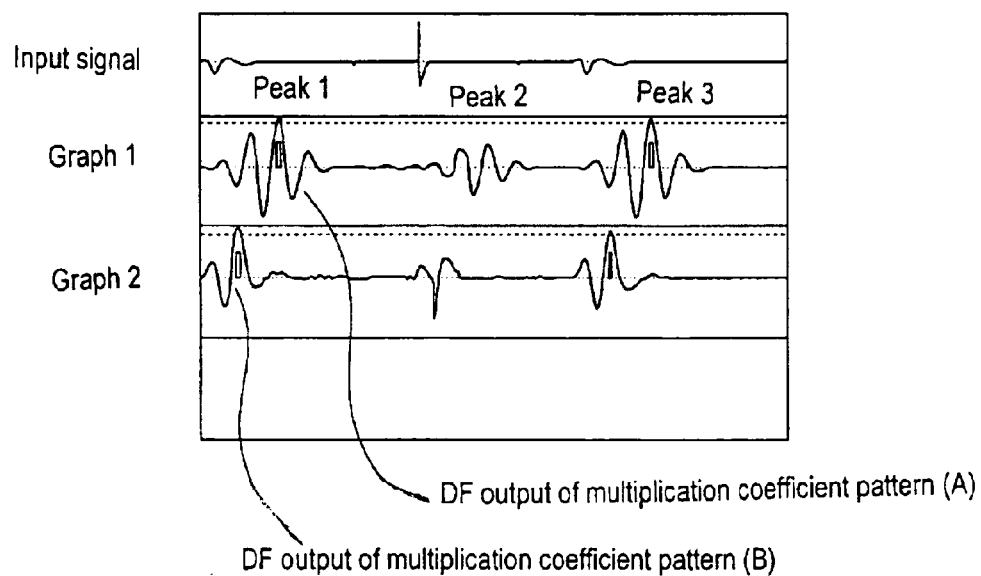
DF output of multiplication coefficient pattern (A)
DF output of multiplication coefficient pattern (B)

Example of DF output for falling input signal peak
FIG. 31A
(A) conventional multiplication coefficient pattern
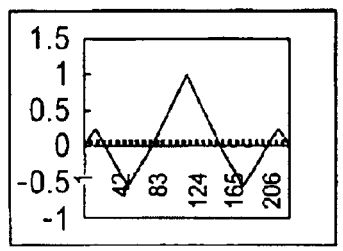
FIG. 31B
(B) rising angle
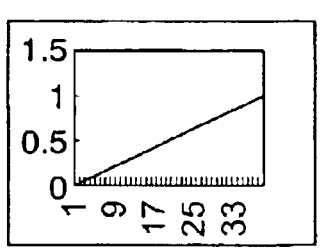
FIG. 31C
C) falling angle
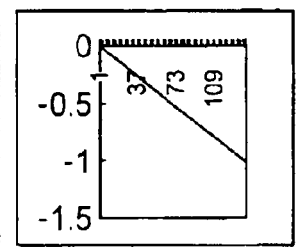
FIG. 31D
Input signal — Peak 1, Peak 2
Graph 1
Graph 2
Graph 3
- conventional multiplication coefficient pattern (A)
- DF output with multiplication coefficient pattern (B)
- DF output with multiplication coefficient pattern (C)

Conventional 1/f fluctuation waveform generator  40

LPF : Low-pass filter
HPF : High-pass filter
K  : Coefficient

WAVEFORM DETECTION SYSTEM AND STATE-MONITORING SYSTEM

FIELD OF THE INVENTION

The present invention relates to a waveform detection system with a signal processing function that detects non-cyclic transient state variations by characterizing and generating output waveforms by 1/f fluctuating input waveforms, and a state-monitoring system using the waveform detection system.

BACKGROUND ART

A wavelet method, commercialized as a result of recent developments of computer technology, is used to search for signs in time-series data in a state-monitoring system. The wavelet method is inferior to Fourier transform in terms of accuracy of spectrum analysis but it is capable of dynamic analysis. The wavelet method more accurately captures spectral changes in both time-series data and images. Currently, the wavelet method is extensively used to detect signs in time-series data and recognize images in image data.

FIGS. 37 and 38 show the structure of a waveform detection system based on the existing wavelet method (hereafter called the wavelet system). The wavelet system comprises, as shown in the figures, a sensor 3, signal input 1, computer 9, determinator 20, and output 25. Input signals are processed at the computer 9 to detect waveforms.

As shown in FIG. 37, the signal input comprises a converter 2 that collects data from the sensor 3, A/D converter 4, memory 5, and data fetcher 7. Measurement values from the sensor 3 are converted into digital data by the A/D converter 4. Input signals are stored in files in the memory 5. Data are supplied for further processing at the computer. The necessary measurement input signal data 8 are created at the computer 9.

The computer 9 comprises a signal processor 11, digital filter calculator 13 comprising multiple digital filters Df1–Dfn, a parameter setter 15, and a synthesizer 17 that integrates the outputs from the digital filters Df1–Dfn. The signal processor 11 at the computer 9 is not essential but can be included as if required. Individually, the signal processor processes noise in the input signals, normalizes data, and distributes multiple data.

The structure of the digital filters Df1–Dfn in the computer is described as shown in FIGS. 39 and 40. In FIG. 37, each digital filter Df comprises a delay memory 16 that stores and delays input signals, and a multiplication coefficient pattern memory 14 that stores multiplication coefficients. In FIG. 38, the parameter setter 15 has a filter parameter setter 29 and a multiplication coefficient pattern setter 30. The computer 9 has a delay memory 16 on the digital filters Df1–Dfn.

As shown in FIG. 40, the digital filter Df outputs the sums of products of input signals and preset multiplication coefficient patterns. The output is large when a waveform close to the shape of the multiplication coefficient pattern is present in the input signals. As shown in FIG. 39, the data in the memory is carried forward as new data enters the memory, so that the filter Df outputs the characteristics at that time together with the time increment. The array of the outputs is thus a distribution of component intensities at a given time, showing the signal characteristics. If the combination of characteristics correlates with the pattern of certain time-series data or the shape of a symbol code, it is possible to detect signs showing variations in the state of time-series data, identify and fetch symbols or codes of an image, or predict changes in input waveforms by highlighting a portion of the fluctuation components of an input signal.

FIG. 46 shows how input signals are processed on a conventional digital filter computer. Three kinds of digital filters perform multiplication individually for the same input signal and the products are summed and synthesized at the synthesizer to generate the output. In this example, different filter shapes are used and three types of outputs each extracting the characteristics of the waveforms are summed to detect the waveform.

The determinator 20 in FIG. 37 compares the synthesized output (digital filter output) from the computer 9 with the threshold value to determine the size difference and derive a result of determination (Ds–j). The output could be a monitor 26 that shows the result of the determination, or an alarm device 28 such as a lamp connected via a contact output 27.

In the wavelet system shown in FIG. 41, multiple digital filter multiplication coefficient patterns are matched to a function pattern called an elemental pattern. Multiple short-period similar patterns are generated from the elemental pattern to determine the intensity of the frequency components. The shape of the elemental pattern determines which components are extracted from the incoming signal. These similar patterns are used to generate filters of a different frequency band to match the length of the multiplication coefficient pattern. The multiplication coefficient pattern also determines the type of signal processing used, such as integration and differentiation, so that once the elemental pattern is determined multiple digital filters with a similar multiplication coefficient pattern perform the same signal processing where only the frequency band is different. In the wavelet system, the scale (length along the time axis) of the basic multiplication coefficient pattern for identifying correlations with input signals is equal to the length of several wavelengths of the respective frequencies. Thus, compared with Fourier transform, the wavelet system can analyze power spectra of a relatively short time interval.

In FIG. 42, a multiplication coefficient pattern typically used in a conventional wavelet system is used to derive the digital filter outputs from an input signal. A wavelet generally has a scale several times longer than the wavelength of the lowest frequency to be characterized. The reference time axis is positioned at the, center of the multiplication coefficient pattern column. The pattern extends on both sides of the axis in the same phase. Some effective output is derived when the input signal arrives at the center of the delay memory with a sequential delay, and an inner product is calculated with the coefficient located at the center of the pattern column. This means that a detection delay proportional to the wavelength always exists when identifying input signal data using this type of multiplication coefficient pattern.

The wavelet is suitable for analyzing cyclic signals that last for a certain time period. It has been used for analyzing voice and vibrations of a certain length, and also for textures (image quality, elemental patterns, etc.) that extend over a certain distance. The signs embedded in time-series data do not have vibration components in many cases. The difference in texture between the entire time-series data and the area containing signs is small as the scale of the multiplication coefficient pattern becomes larger. It is thus difficult to detect a transient decrease in this case. The size of the scale is a major problem in analyzing non-cyclic signals with small repetitive vibrations or small-area images. It is difficult for the wavelets to characterize one-time pulses such as those in the input signals shown in FIGS. 31A, 31B, 31C and 31D. This is because the wavelet focuses on the damping curves and undulation of specified sounds, and as such, it does not effectively identify signals by sound reverberation. When the rise and fall of an input signal have a different waveform such as shown in FIG. 42, identifying only the rising waveform is difficult, with the result that the normal waveform WA and abnormal waveform WB are not differentiated, and the system reacts strongly to the normal waveform WC.

Apart from the above, many studies are being undertaken to realize human-friendly control by performing 1/f fluctuation conversion for input waveforms. FIG. 43 shows a typical conventional 1/f fluctuation waveform generator. Conventional low-pass (LPF) and high-pass filters (HPF) are combined to approximately generate the 1/f fluctuation waveforms. Random waveforms are input and the high-pass filter coefficients are adjusted to derive the 1/f fluctuation waveforms. This means that the characteristic of the conventional low-pass filter is damped by a tilt of −2 or more. The tilt of the target 1/f fluctuation is −1. The high-pass filters with a tilt of 2 or more, which are multiplied by coefficient k, are combined in parallel to make a filter set. Adjusting coefficient k derives a tilt of approximately −1. Filter sets of a different band are connected in series to expand the filter characteristics to a wider frequency region.

The problem with this system is that precision operational amplifiers must be used to construct the target filters with electric elements, and the production involves very large-expenses. To construct the original, the filters of the above hardware are used as the above digital filters, and then filter sets are constructed. This can be achieved relatively easily. For example, the conventional multiplication coefficient pattern-(A) shown in FIG. 29 may be used as the multiplication coefficient pattern of the low-pass filter LPF. High-pass filters HPF can also be configured in like manner. However, low-pass filters (LPFs) and high-pass filters (HPFs) have a different phase gap (difference of time of change between input and output) so that it is difficult to synthesize multiplication coefficient patterns of both filters to generate a new one. A more complex means is required to generate a multiplication coefficient pattern for high-pass filters (HPFs) by converting the value of coefficient k and then synthesizing the patterns of both filters.

The other conventional technique uses ½-time integration. The input is a random progression derived from random functions, and the power spectrum of the output is approximated to 1/f fluctuation. The details have been described in a book (Kazuo Tanaka; Intelligent Control System [Intelligent Control by Fuzzy Neuro, 6A Chaos], Kyoritsu Shuppan Co.). Of the above low-pass filters (LPFs), the digital filter Df with a primary delay with a number of integration equivalent to 1 will generate outputs of the power spectrum with a −2 tilt. To perform a −1 tilt power spectrum conversion, the number of integration is reduced to less than 1 to smooth the random progression. FIGS. 44A, 44B, and 44C show a multiplication coefficient pattern of ½-time integration with 8-tap digital filters Dfs (FIG. 44A), and the resultant conversion outputs (FIGS. 44D and 44C). FIGS. 45A, 45B and 45C show a multiplication coefficient pattern of ⅓-time integration with 8-tap digital filters Dfs (FIG. 45A), and the resultant conversion outputs (FIGS. 45B and 45C). The number of integrations is less than 1 in both cases. To derive a smooth 1/f fluctuation with a −1 tilt, the number of taps must be increased. The power spectrum curve will not be smooth if the number of digital filter taps is small.

In consideration of the above condition, the present invention solves the problems of conventional wavelet systems by:

a. Contrary to the underlying concept of conventional wavelet systems, it ignores frequency separation characteristics and instead maximizes the phase characteristics (ability to identify undulation and other anomalies), and b. Makes final determination by matching the timing of phase delay (gap of detection time) of multiple filters.

Another objective of the present invention is to solve the above problems of conventional 1/f fluctuation conversion by setting and shaping the digital filter multiplication coefficient patterns using mathematical formulae and software.

The present invention focuses attention on the fact that the digital filters (Dfs) emit outputs by predicting the transition of input waveforms when signals are input and a portion of the fluctuation-components of, the input signal-is-highlighted. The present invention therefore uses digital filters (Dfs) to output 1/f fluctuation waveforms and other specific waveforms using non-integer n-time integration.

The present invention discerns sound and noise and other one-time undulation in time-series data and also identifies the characteristic of individual single pulses (pulsation). As a result, it can be used for predictive diagnosis and determination of acceptance or rejection of merchandise. It is also possible for the system of the present invention to input random waveforms and output specific waveforms with a frequency component distribution such as 1/f fluctuation waveforms. A similar technique is known at this time, in which undulation and pulse waveforms are approximated with a sequential line and the sequential line coordinates are input to discern the difference of patterns in a neural network. This technique involves complex procedures and huge computation overhead so that the system cost is quite high. Furthermore, slow pulses are processed but real-time processing is impossible. The present invention characterizes a wide range of waveforms from pulse sounds containing sharp and high-frequency components to very long cyclic time-series data with little change recurring slowly over a long time period. Furthermore, the processing procedure is not complex. The present invention can also easily output specific waveforms such as 1/f fluctuation waveforms by-effectively using digital filters embedded in the above waveform converter.

DISCLOSURE OF THE INVENTION

The present invention provides the following means to solve the above technical problems:

A waveform detection system 10 comprising a sensor 3, a signal input 1, a computer 9 to characterize signal data based on signals output from the signal input 1, a determinator 20 to identify the characteristics of the waveforms based on the output of the computer 9, and an output 25 to show the result of the determinator 20, wherein the computer 9 has a digital filter calculator 13, a phase-matching parameter setter 19, and a synthesizer 17; the digital filter calculator 13 has digital filters DFs each equipped with a delay memory 16 to store and delay input signals and a multiplication coefficient pattern memory 14 to store multiplication coefficient patterns, and a parameter setter 15; the parameter setter 15 has a multiplication coefficient pattern setter 30 to set multiplication coefficient pattern and a filter parameter setter 29; the digital filter calculator 13 connects signal data input from the signal input 1 to the digital filters Dfs, calculating and outputting the sum of products for the contents of both memories; the outputs of the digital filter calculator 13 are merged at the synthesizer 17, and signs of state change are characterized based on the synthesized output, wherein, furthermore, multiple digital filters are installed at the digital filter calculator 13 in the computer; the coefficient patterns derived from non-integer n-time integration are used as elemental multiplication coefficient patterns; a means is provided to change the phase of at least one of the elemental patterns, input signal data, and digital filter output (phase-matching parameter setter 19); and the outputs of digital filters Dfs that use the elemental patterns are synthesized in a state where the portion of the phases of the characteristics extracting and processing function is changed.

The means is also a waveform detection system 10 equipped with a computer 9 to characterize signal data and a parameter input, wherein the computer 9 has a digital filter calculator 13 and a parameter input; the digital filter calculator 13 has digital filters Dfs each equipped with a delay memory 16 to store and delay input signals and a multiplication coefficient pattern memory 14 to store multiplication coefficient patterns, and a-parameter setter 15; the parameter setter 15 has a multiplication coefficient pattern setter 30 to set multiplication coefficient pattern via a parameter input and a filter parameter setter 29; the digital filter calculator 13 connects signal data input from the input to the digital filters Dfs calculating and outputting the sum of products for the contents of both memories; the multiplication coefficient patterns are prepared to have a simply decreasing or simply increasing tilt; and the output of the digital filter calculator 13 is a conversion output, wherein, furthermore, the multiplication coefficient patterns are elemental multiplication coefficient patterns derived from non-integer n-time integration; and the number of integration n to get a frequency response power spectrum tilt of 1 or −1 in a portion of the frequency band is used to adjust the digital filter output.

The means is also a state-monitoring system wherein the characteristics of a waveform are extracted from the signal data input using the waveform detection system 10 of the above structure, and based on the above characterized waveform, the state of the input signals is determined and displayed.

BRIEF DESCRIPTION OF THE DRAWINGS

FIGS. 4A–4G are graphs showing conventional procedure for setting multiplication coefficient patterns;

FIG. 5 shows graphs of generation of elemental patterns from n-time integration using the present invention;

FIGS. 13A–13D are graphs showing two elemental patterns synthesized to generate the multiplication coefficient pattern shown in FIG. 11;

FIG. 26 is a block diagram showing a structure of the waveform detecting function;

FIGS. 29A–29C are graphs showing comparison of digital filter outputs for the same input signals derived from conventional multiplication coefficient patterns and from the multiplication coefficient patterns by means of the present invention;

FIGS. 31A–31D are graphs showing comparison of detected waveforms derived from the above state-monitoring system;

FIGS. 45A–44C are graphs showing multiplication coefficient patterns of ⅓-time integration with the same 8-tap digital filters as used in FIG. 44A, and the relevant conversion output diagrams (FIGS. 45B and 45C)

DETAILED DESCRIPTION OF THE PREFERRED-EMBODIMENTS

Figure 1:
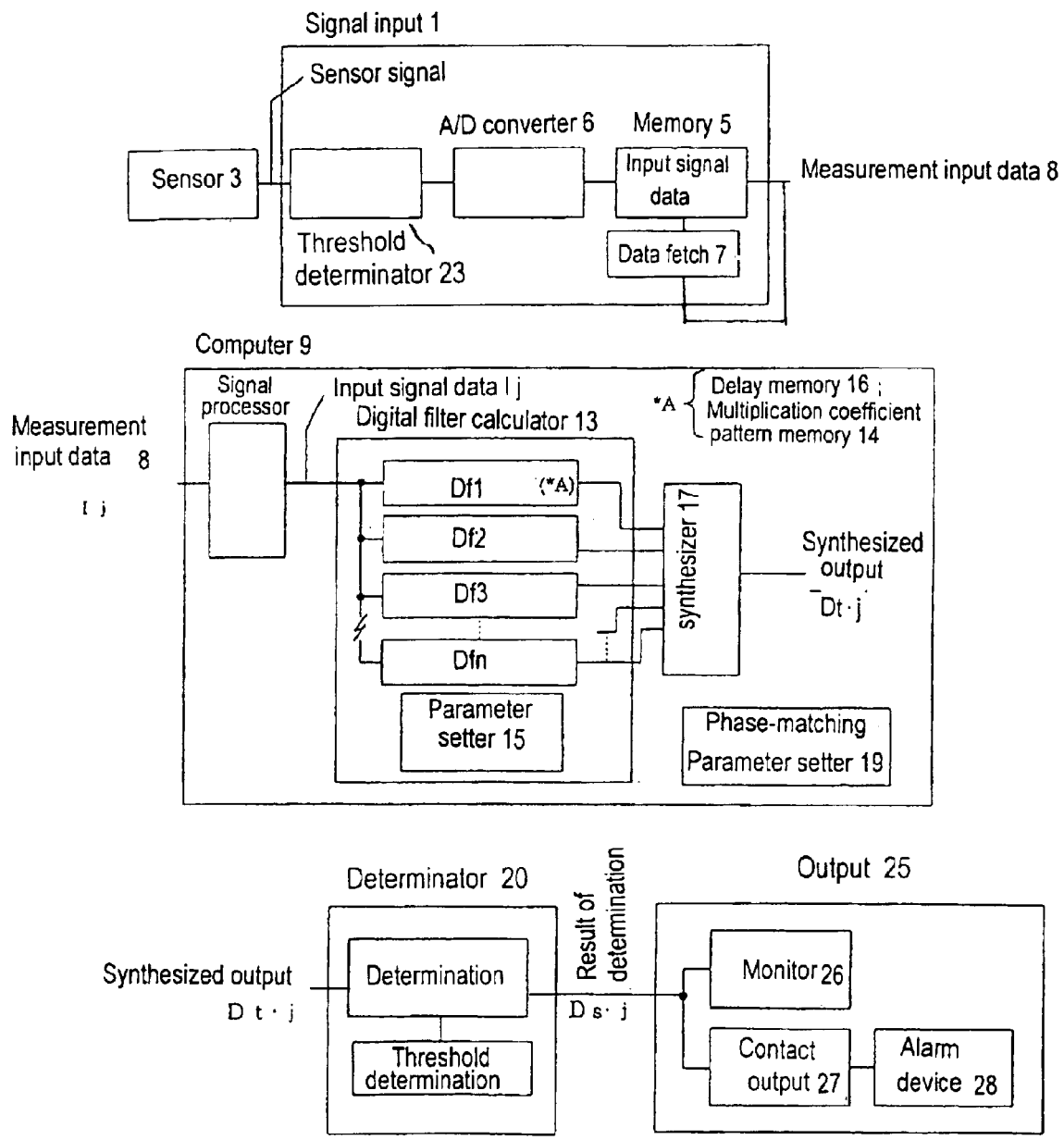
FIG. 1 is a block diagram showing a waveform detection system according to one of the embodiments of the present invention.

Preferred working examples of the waveform detection system with the signal processing function of the present invention and state-monitoring systems using the system are described below. FIG. 1 shows the structure of a working example of the waveform detection system. The system comprises, as shown in the figure, a sensor 3, signal input 1, computer 9, determinator 20, and output 25. These hardware components are the same as those used in the above wavelet type waveform detection system. The main structural features of the system are described below again.

The signal input 1 comprises a converter 23 that collects sensor output data, an A/D converter 4, and a memory 5. The signal input 1 converts measurement values sent from the sensor 3 into digital data. The memory 5 stores the input signals in files, and sends data as processing at the computer progresses to generate input (measurement) signal data 8 at the computer 9. The memory 5 is not essential if signals are processed on a real-time basis. In this case, the real-time measurement data are digitized and sent directly to the computer 9.

The computer 9 comprises a signal processor 11, a digital filter calculator 13 comprising multiple digital filters Df1–Dfn and a parameter setter 15, a synthesizer 17 to integrate the outputs, and a phase-matching parameter setter 19. The signal processor 11 is not essential, but is installed as required. As an independent device, the signal processor 11 is responsible for-reducing noise, normalizing data, and distributing multiple data.

Figure 2:
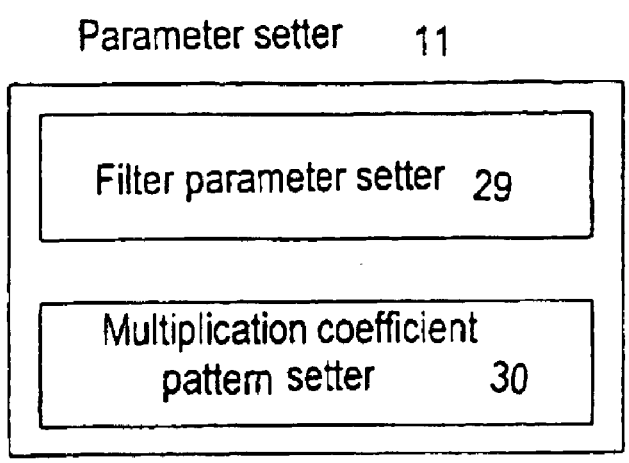
FIG. 2 is a block diagram showing a parameter setter of the waveform detection system shown in FIG. 1.

The digital filter Df has a delay memory 16 to store and delay input signals and a multiplication coefficient pattern memory 14 to store multiplication coefficient-patterns. The parameter setter 15 has a filter parameter setter 29 and a multiplication coefficient pattern setter 30 as shown in FIG. 2. At the computer 9, a phase memory DI is installed in each of the digital filters Dfs, and the phase-matching parameter setter 19 determines the delay time operation of the phase memory DI. Outputs from multiple digital filters Dfs are individually delayed to match the phase, and the waveforms are synthesized at the synthesizer 17 and synthesized output (Dt–j) is output.

Figure 46:
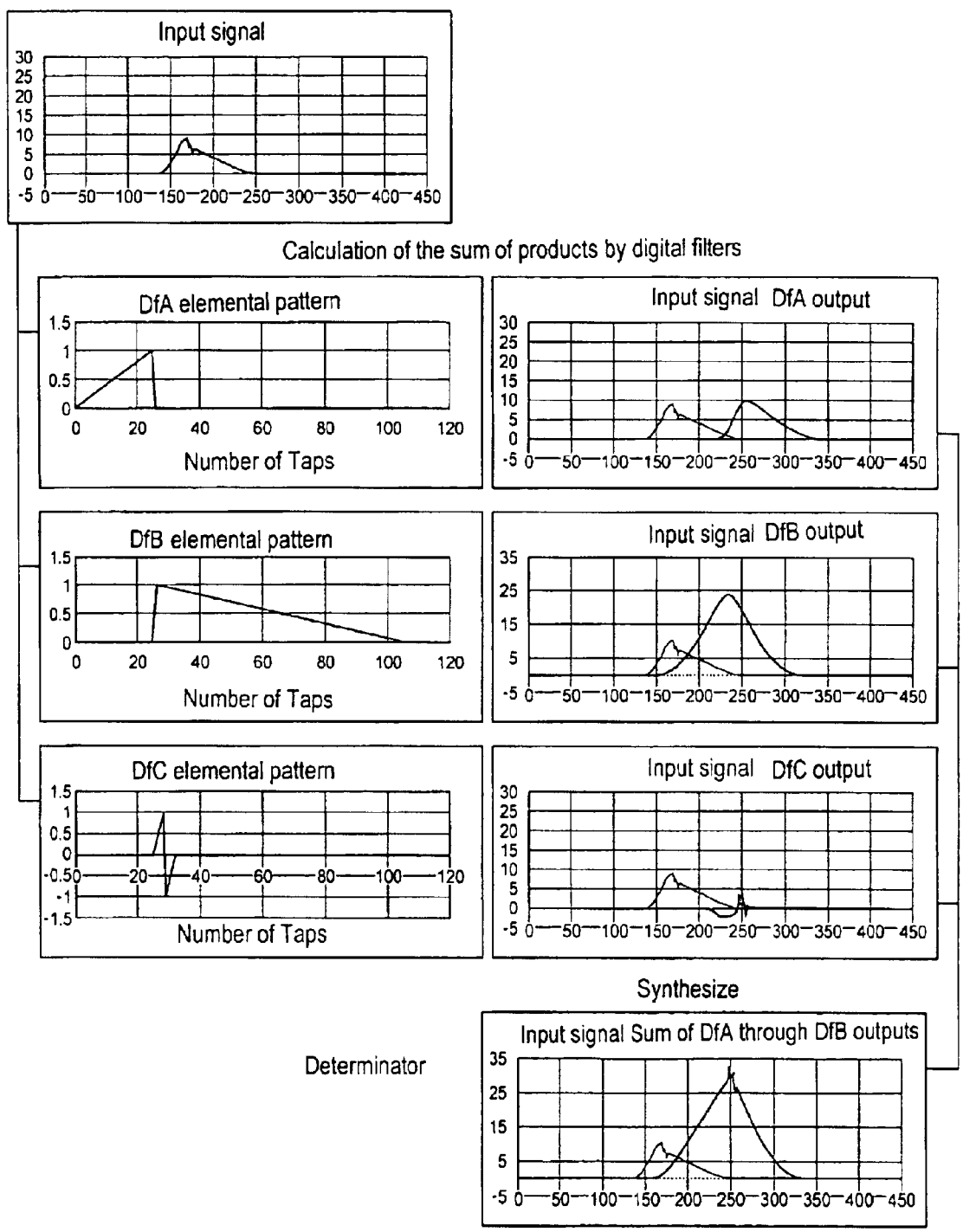
FIG. 46 is a combined block diagram and graphs showing calculation of the sum of products and synthesis.

An example of signal processing at the digital filter calculator 13 is shown in FIG. 46. Three kinds of digital filters Dfs together perform a sum of products calculation for the same input signal. The outputs are then synthesized at the synthesizer 17. The filters Dfs have a different shape from each another in this example, and the three kinds of outputs each extracting the features of waveforms are summed to detect the waveform.

The multiple digital filters Dfs use an elemental pattern for the base of multiplication coefficient patterns of each digital filter Df. The shape of a multiplication coefficient pattern is determined using the phase, number of taps, and the sum of coefficients of the elemental pattern as the parameters. Two alternatives exist: one is to synthesize waveforms at the synthesizer 17 using outputs from multiple digital filters Dfs that use their respective elemental patterns and the other is to first synthesize elemental patterns to generate a-new single multiplication coefficient pattern, which is set to a single digital filter Df to generate outputs. Both methods produce an identical waveform conversion effect. In a converter which processes already synthesized multiple elemental patterns, phase matching and waveform synthesizing are already in the new synthesized multiplication coefficient pattern, and thus both are an essential component. The synthesized output from the computer 9 is compared with the threshold value at the determinator 20 to determine the size and generate the result of determination (Ds-j). At the output 25, the result of determination is displayed on a monitor 26, or activates an alarm lamp (alarm device) 28 or other warning device via a contact output 27.

Figure 36:
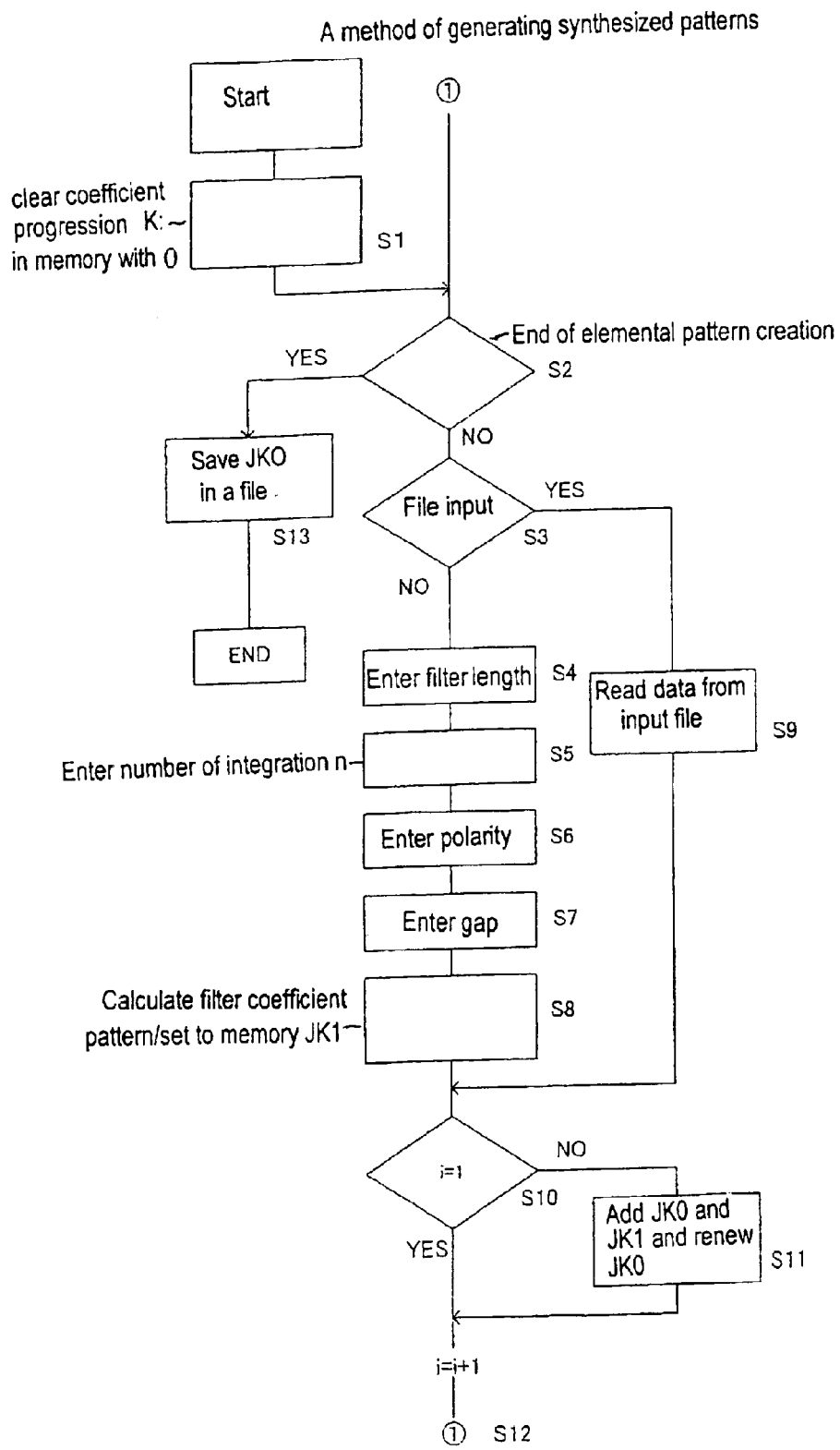
FIG. 36 is a development flowchart for multiplication coefficient pattern by means of the present invention.

The Method (procedure) for generating a synthesized patterns is described below as shown in the flow chart in FIG. 36.

This flow chart is used to enter the parameters for elemental patterns (JK1), calculate the elemental patterns, and generate a pattern (jk0) by synthesizing the elemental patterns that are entered.

Step S1: Zero-clear JK0 (synthesized pattern).

Step S2: Repeat loop (1) until designation of elemental pattern completes.

Step S3: Specify file input or no file input. Memory designation allowed if elemental patterns exist in memory.

Step S4: Enter base (number of taps), a parameter for the elemental pattern in FIG. 7.

Step S5: Enter number of integration n, a parameter for the elemental pattern in FIG. 7.

Step S6: Enter polarity (+, −), a parameter for the elemental pattern in FIG. 7.

Step S7: Enter gap for generating a synthesized pattern.

Step S8: Calculate elemental pattern by linear approximation using parameters for the elemental pattern specified in Steps S4 through S7. Set the result in JK1.

Step S9: Read elemental pattern from file and set in JK1. Alternatively, copy elemental pattern from other memory to JK1.

Step S10: Determinator if i=1.

Step S11: Add elemental pattern (JK2) specified or created in Steps S4 through S9 to JK0 (synthesized pattern).

Step S12: Add 1 to counter I.

Step 13: If necessary, save JK generated in Steps S through S12 in a file.

This completes the generation of a synthesized pattern.

The internal structure of the above computer 9 is described below in more detail.

Figure 3A:
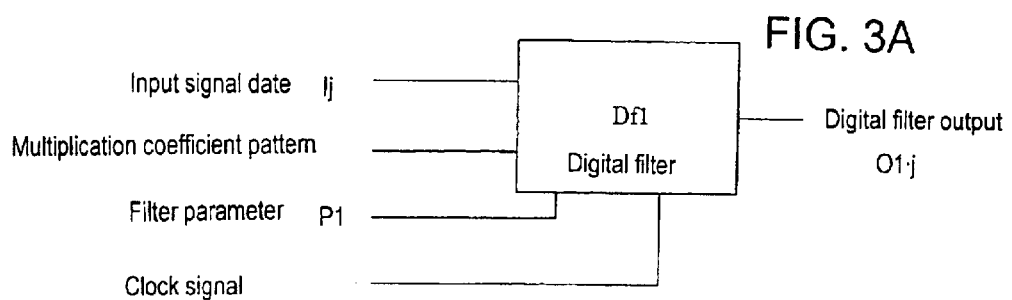
FIG. 3A is a block diagram showing general digital filter functions of a computer.
Figure 3B:
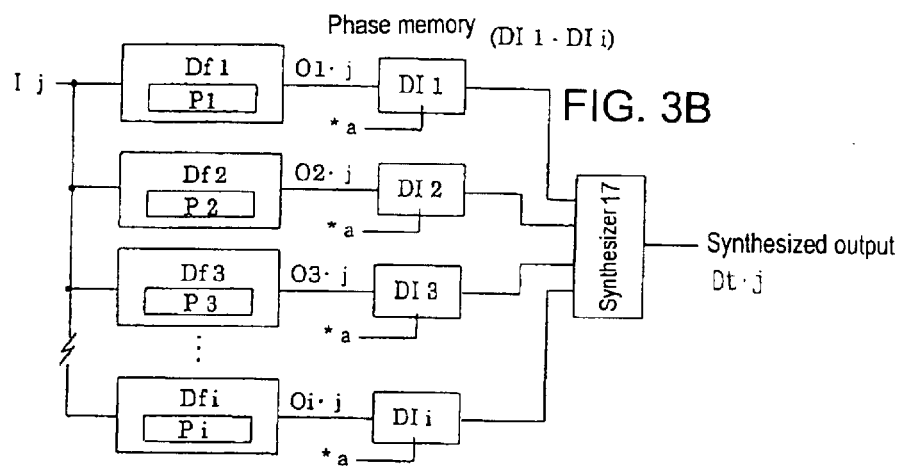
FIG. 3B is a block diagram-showing a computer incorporating the digital filters shown in FIG. 3A.
Figure 3C:
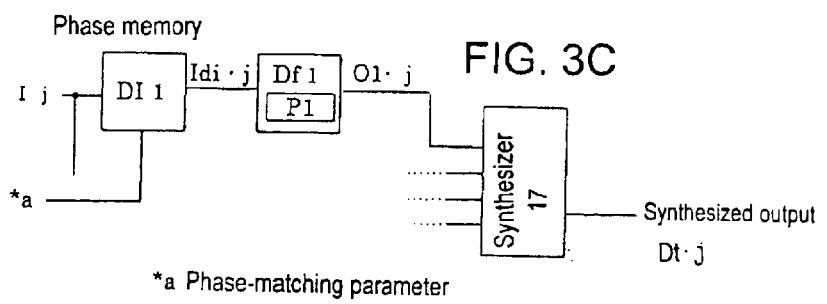
FIG. 3C is a block diagram showing a phase memory provided on the inlet side of the digital filter.

FIG. 3A illustrates the digital filter function comprising the digital filter calculator 13. FIGS. 3B and 3C illustrate a computer 9 equipped with the digital filters Dfs shown in FIG. 3A.

Digital filter Df1 accepts input signal data Ij, multiplication coefficient pattern P1, filter parameters, and clock signals. After computation, digital filter output (O1-j) is generated.

Input signal data Ij is an array like time-series data. The multiplication coefficient pattern is a pattern signal derived from a procedure to be described later. Filter parameters are data inputs set by the above filter parameter setter 29. They comprise the number of digital filter taps, multiplication coefficient pattern data, synthesis weighting pattern data specified for the synthesizer 17, and other components. In this particular example, the phase-matching parameter setter 19 specifies phase-matching parameters, which are additional to the filter parameters.

The phase-matching parameter specifies a delay time for a phase memory DI that is installed in each digital filter, in addition to the delay memory 16. One of the simple methods is to use the number of taps of the phase memory DI as a parameter. When the number of taps is set by the parameter, a clock counter is installed to temporarily store the output of digital filters. When the clock counter is equal to the preset number-of taps the temporarily stored output is output as a delay output.

When the timing of an input signal is delayed, the relevant filter output is correspondingly delayed but the output itself remains the same. This is because the characteristic of a digital filter Df is uniquely determined by the multiplication coefficient pattern. For this reason, no functional difference occurs whether the above phase memory DI is installed on the output side of the digital filter Df, as shown in FIG. 3B, or on the input side, as shown in FIG. 3C.

The above hardware and its configuration are exactly the same as that of a conventional wavelet type waveform detection system.

The procedure for setting multiplication coefficient patterns for digital filters Dfs, the feature of the present invention, is described below. The feature of the present invention is that numerical expressions are used to model multiplication coefficient patterns and the multiplication coefficient patterns are set using software.

As an example, non-cyclic and non-repetitive transient variations are assumed and the procedure for setting multiplication coefficient patterns for characterizing the variations is described below.

The multiplication coefficient pattern may be used by transferring those progressions that are already input into the parameter setter in the computer 9 shown in FIG. 1 to the multiplication coefficient pattern memory 14 of respective digital filters Dfs. Changing the pattern transforms the characteristics of digital filters Dfs and thus the pattern is normally renewed when the system is operating or used in a semi-stationary (stand-by) state.

FIGS. 4A–4G show the procedure for setting the multiplication coefficient pattern. The horizontal axis represents time t. The time is more recent as you move rightward on the graph. The pattern in FIG. 4A is typical of a conventional digital filter used as a band-pass filter. When the number of taps of a digital filter is set to n in actual application, FIG. 4A is split into n sections in the direction of time and the values corresponding to the split points are taken as a progression to make a multiplication coefficient pattern. Period tc of a cycle shown in FIG. 4A determines the frequency characteristic of the filter. When the pattern shown in FIG. 4A is used, the filter selectively extracts the waveforms of frequency f=tc/2ÉŒ.

The present invention uses the multiplication coefficient pattern development procedure disclosed in the publication of unexamined patent application No. 260066-1998. Using this procedure, the waveforms on the left side of the center in FIG. 4A are selected to keep the past waveforms and the waveforms, on the right side of the center are deleted as shown in FIG. 4B. All these are performed on a computer screen. The waveform equivalent to ¼tc from the center is picked as shown in FIG. 4C and the remainder is deleted to derive a waveform section shown in FIG. 4D. The waveform shown in FIG. 4D represents a one-quarter period of the fundamental waveform. Periodic vibration components are not saved, but the shape of the rising fundamental waveform is kept. The right-side edge of the waveform (or the center of the figure) represents the most recent time. This point is used in the calculation with the most recent data when measurement data is given as input signals. The shape of the rise in FIG. 4D is used as the multiplication coefficient pattern for digital filters Dfs. When the incoming signals have the same shape as the rise of the fundamental waveform, the output (or the result of matching) is the highest. When the incoming signals have a different rising shape, the output decreases. The output values vary with the level of matching of the rising shape, so that a digital filter Df assigned with a specific pattern can detect the phases differences from the fundamental waveform and output the result. The pattern in FIG. 4D may be used as it is. In the publication of unexamined patent application No. 260066-1998, a straight-line pattern with the base ta (=¼ tc) is defined as an elemental pattern, which is further abstracted into simple elemental patterns. Phase difference is detected using multiple phase combinations.

The above procedure to select sectional figures on a computer screen to define multiplication coefficient patterns like those shown in FIGS. 4F and 4G necessitate calculation of the linear sum of multiple elemental patterns at the synthesizer in order to derive a waveform from the outputs of digital filters. This involves the following problems:

a. The required number of elemental pattern parameters to define a multiplication coefficient pattern is 2× (number of elemental patterns). The operator must use at least 4 parameters to develop a filter pattern. This can lead to a great number of trials and errors.

b. Even if the operator defines the tap length to determine the major frequency characteristics for the digital filters, the shape will vary when combining multiple parameters. It is not easy for the operator to estimate and determine the filter shape or digital filter characteristics;

To solve these problems, the present invention proposes the use of the formula described below to define multiplication coefficient patterns suitable for various waveforms. The procedure for using this formula is described below as shown in FIG. 5.

The elemental multiplication coefficient patterns are calculated and defined using non-integer n-time integration in the present invention.

Non integer n-time integration is represented by the following formula (1):

$$In(\emptyset(t)) = (1/\Gamma(n))\int \emptyset(t-\tau)\tau^{\wedge}(n-1)d\tau \text{ (range of integration } 0 \leq \tau < \infty)$$

where:
Ø (t): input waveform
Γ (n): known nth-order Γ function of the following expression:

$$\Gamma(n) = \int e^{\wedge}-(t-\tau)\tau^{\wedge}(n-1)d\tau \text{ (range of integration } 0 \leq \tau < \infty) \quad (2)$$

The coefficient $\tau^{\wedge}(n-1)$ for Ø(t) on the right side of formula (1) represents the outline of the multiplication coefficient pattern:

$$y0=\tau^{\wedge}(n-1) \quad (3)$$

to calculate inner product for input waveforms with τ as the time variable. The outline is a simple decreasing curve that is a downward convex shape for the number of integration n<1 as shown in FIG. 5. The number of integration n=0.5 for the case described in FIG. 5.

In case of n=1, the outline is like a step function, or 1 in the integration section and 0 in other sections.

Conventional 1/f fluctuation conversion with digital filters involves the problem of an increased number of taps to get smooth 1/f fluctuation characteristics with −1 tilt for the FFT spectrum using non-integer-time integration.

It may be desirable to decrease the time delay for digital filter outputs to lessen the computation overhead. This can indeed be achieved by decreasing the number of taps to use but if this is done the end point will not approach zero smoothly but will suddenly drop to zero. This causes a bias damping peculiar to digital filters Dfs. The power spectrum curve is never smooth if this occurs. To solve this problem, we multiply the linear equation for processing the end point shown in FIG. 5:

$$y1=1-(1/L)(\tau-1) \quad (4)$$

where:
L: number of filter taps
by y0 to get:

$$y=y0 \times y1 \quad (5)$$

Function y presents an outline that is a downward convex shape like equation (2), with y1 approaching zero smoothly.

We derive elemental patterns by substituting the values for the points along the time axis of function y (equation 5) in the multiplication coefficient patterns.

For n<0, no mathematical meaning exists but the shape of a digital filter Df approaches zero more sharply, which is meaningful in the present invention.

Figure 6:
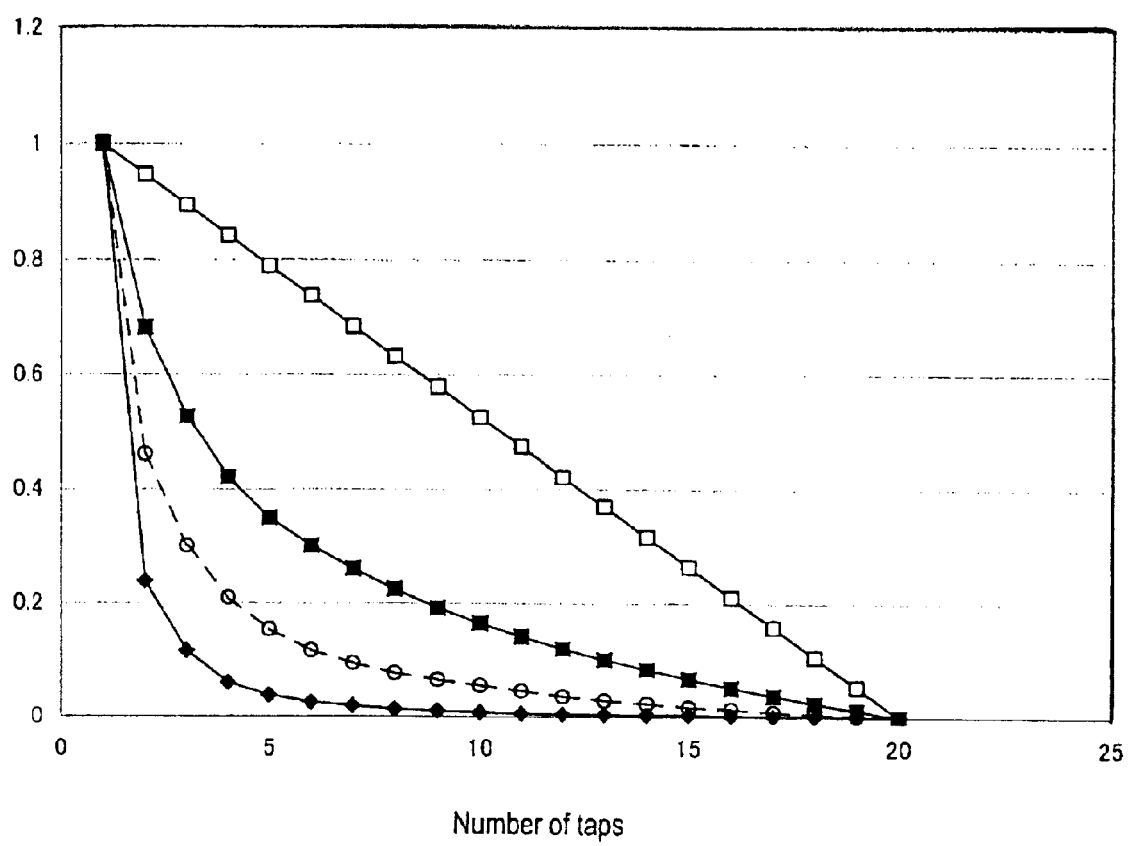
FIG. 6 shows a graph of different shapes of elemental patterns derived from n-time integration using the present invention.

FIG. 6 shows the variable shapes of elemental patterns due to the number of integration n. The figure covers the range of 0 through −1. The value n uniquely determines the shape of the filter coefficient pattern. It is also easy to adjust the shape and frequency characteristics relative to the target waveform simply by changing the value of n and the number of filter taps. This leads to significantly decreased trials and errors during adjustment by the operator. No limit applies to the value n so far as the shape of the filter coefficient pattern is concerned provided that a means is used to make the diverging side approach zero asymptotically in equation (3).

Each elemental pattern consists of positive (+) polarity only. When inputting a digital filter signal that changes from zero to one at a certain time and remains at that level thereafter (step-like waveform signal), the sum of the products with the elemental pattern is, after the input signal continues as I for a certain time, equal to the sum of all coefficients each multiplied by 1 for outputs of a finite value, and this value is maintained.

This means that the above elemental pattern performs a kind of partial integration over the length (=interval) of the digital filter (integration characteristic pattern). In like manner, those patterns with an opposite tilt or-patterns with negative polarity also produce an elemental pattern respectively, acquiring the integration characteristic as in the above case. To assign a differentiation characteristic for the same input to get zero output, the elemental patterns are arranged symmetrically as shown in FIG. 4G so that the sum of all coefficients equals zero (differentiation characteristic pattern). In this case, the negative (−) side load pattern shows the falling characteristic. If the length is the same ta in this particular case, the filter will detect phase difference with the fundamental frequency in which rise and fall are uniquely determined by ta.

Figure 7:
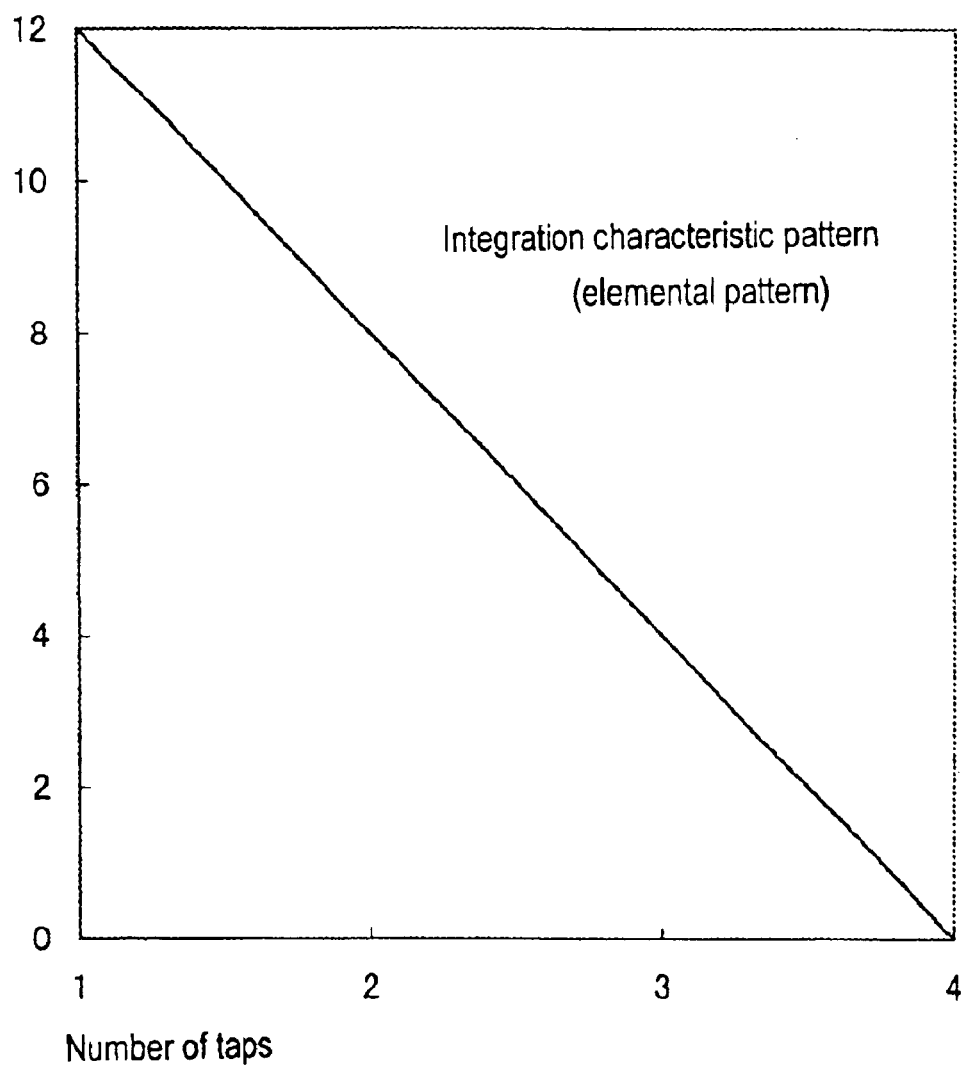
FIG. 7 is an example using the pattern shown in FIG. 4F as the multiplication coefficient pattern.
Figure 8:
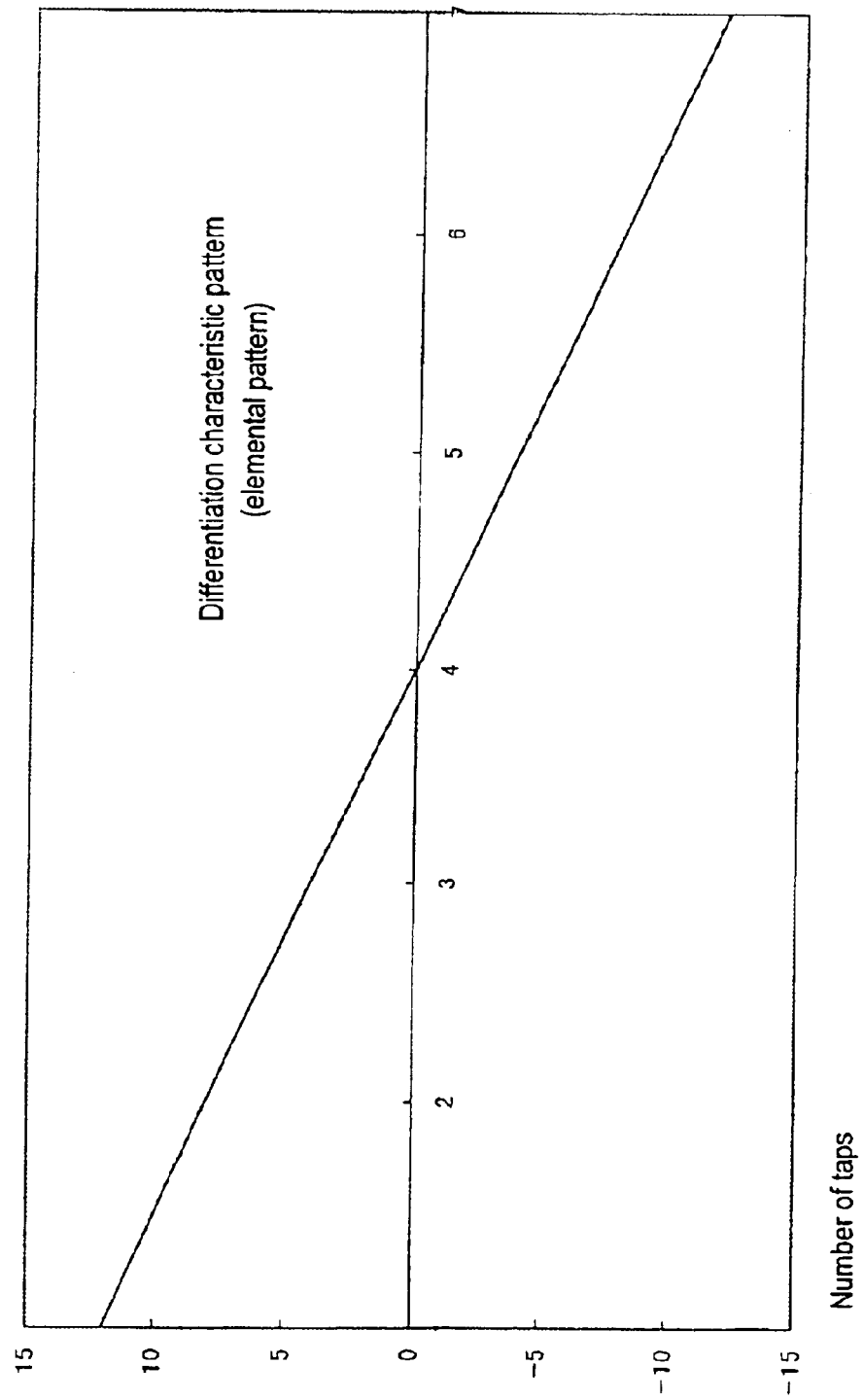
FIG. 8 shows an example using the pattern shown in FIG. 4G as the multiplication coefficient pattern.

FIGS. 7 and 8 show the order of the patterns when the patterns in FIGS. 4F and 4G are set as multiplication coefficient patterns. The time is more recent towards the left side of the graph. FIGS. 7 and 8 show the multiplication coefficient patterns with the integration and differentiation characteristic, respectively.

Figure 9:
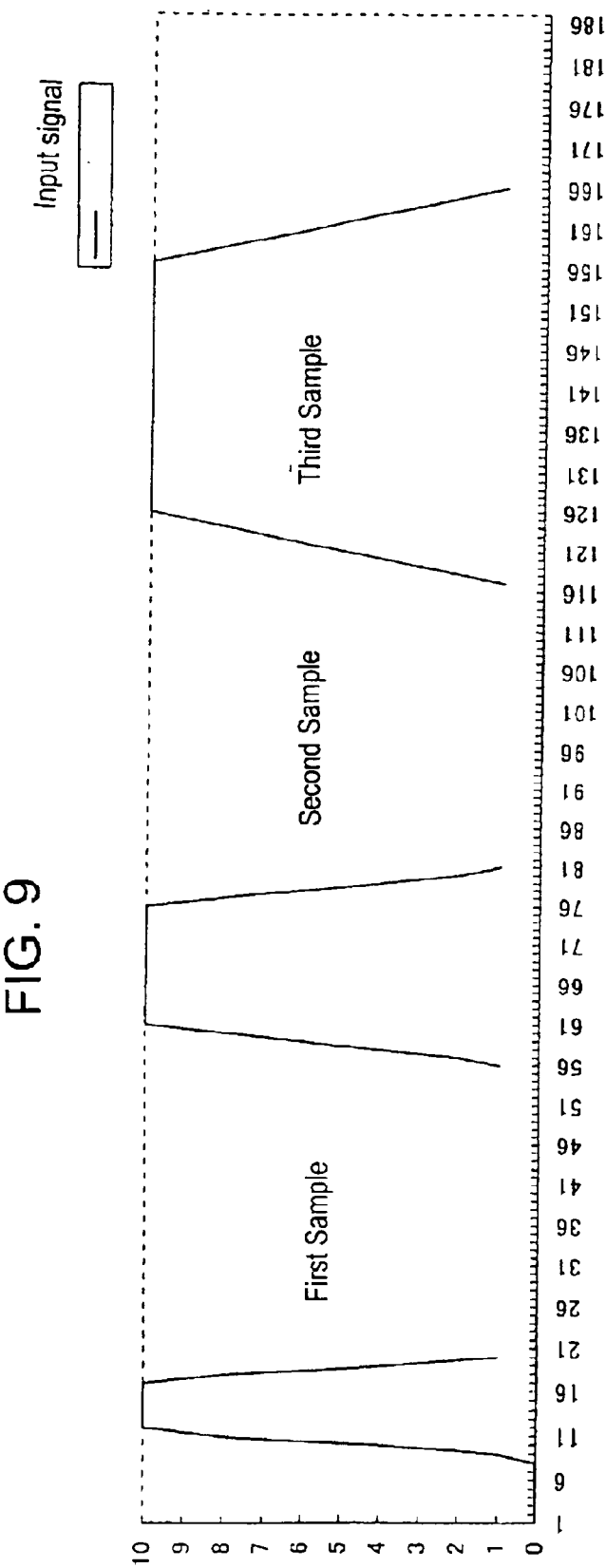
FIG. 9 is a graph showing three kinds of waveforms representing input signal data for testing.

FIG. 9 shows waveforms of the three input signal data used for-testing. Both rise and fall are-gentler with the increasing width. All of these multiplication coefficient patterns are set with software using the above formulas.

Figure 10:
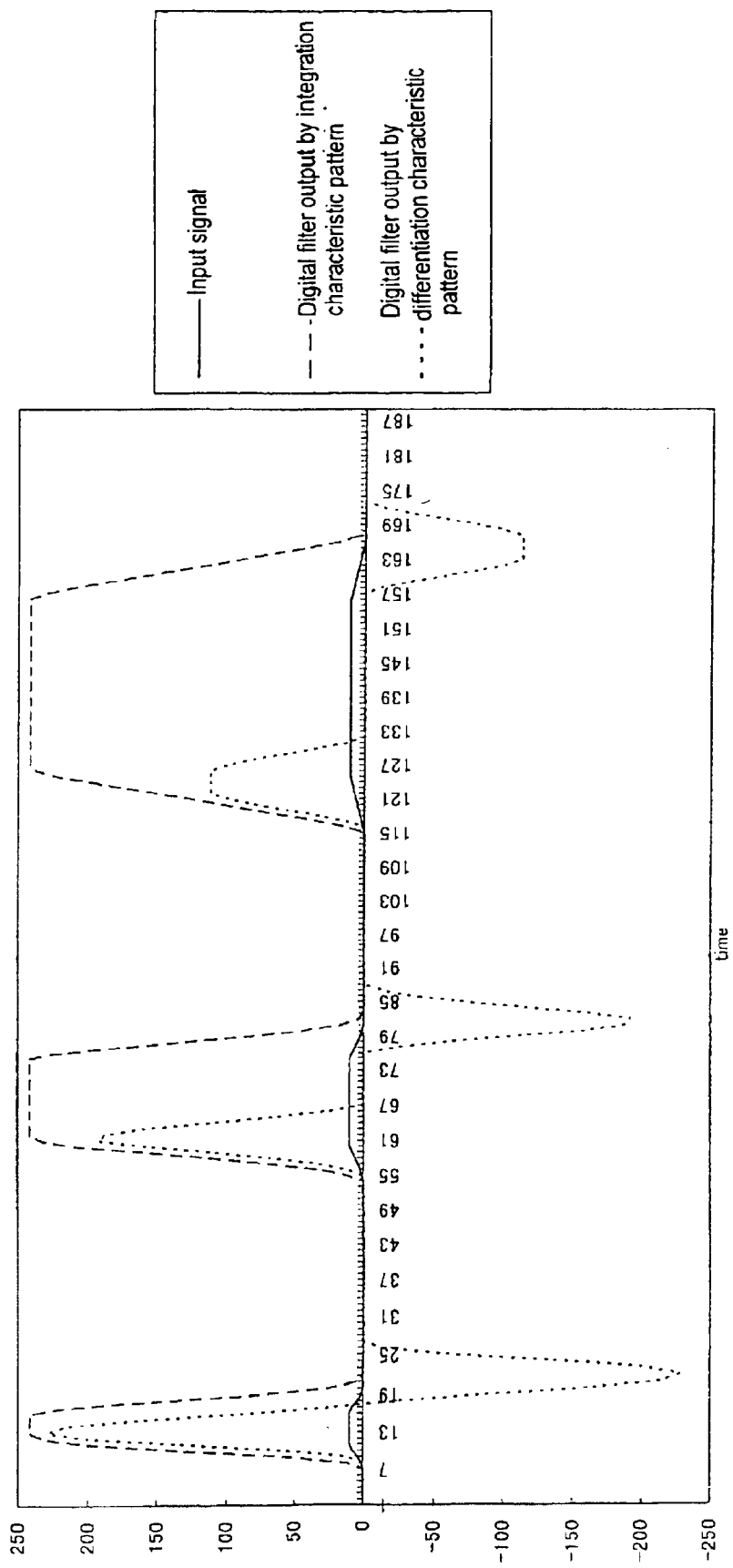
FIG. 10 is a graph showing two kinds of digital filter outputs where the input signal data for testing shown in FIG. 9 are used in the integration characteristic patterns in FIGS. 7 and 8.

FIG. 10 shows the output waveforms from two kinds of digital filters. The input signal data for testing shown in FIG. 9 are used as inputs to derive integration characteristic patterns shown in FIGS. 7 and 8. The output of the filter with the integration characteristic pattern rises with a time delay to the input waveform, reaches a-certain level where it stays, and then falls gradually also with a time delay to the input waveform. The time delay of the waveform is equivalent to a temporary storage of a portion of the input signals in the digital filter, or integration by parts. This function is the same as the function of a low-pass filter used in electronic circuits, and can be used to remove noise and smooth input signals.

The output of the filter with the differentiation characteristic pattern responds to the rise of input signals with a sharp pulse. A sharp pulse is also output at the rise of an input. The output is zero when the input is constant and remains. The output is large when the tilt of the rise or fall of an input is large. This type of filter with a differentiation characteristic is suitable for detecting tilts. To clarify the difference between a conventional multiplication coefficient pattern such as shown in FIG. 4A and the pattern of the present invention, we use multiplication coefficient patterns for testing shown in FIG. 11. As is clear in the figure, the conventional pattern requires 29 taps although the pattern is simplified from that shown in FIG. 4A. With the present invention, in contrast, the system operates with only 7 taps, or as short as less than one-fourth of the conventional system.

Figure 12:
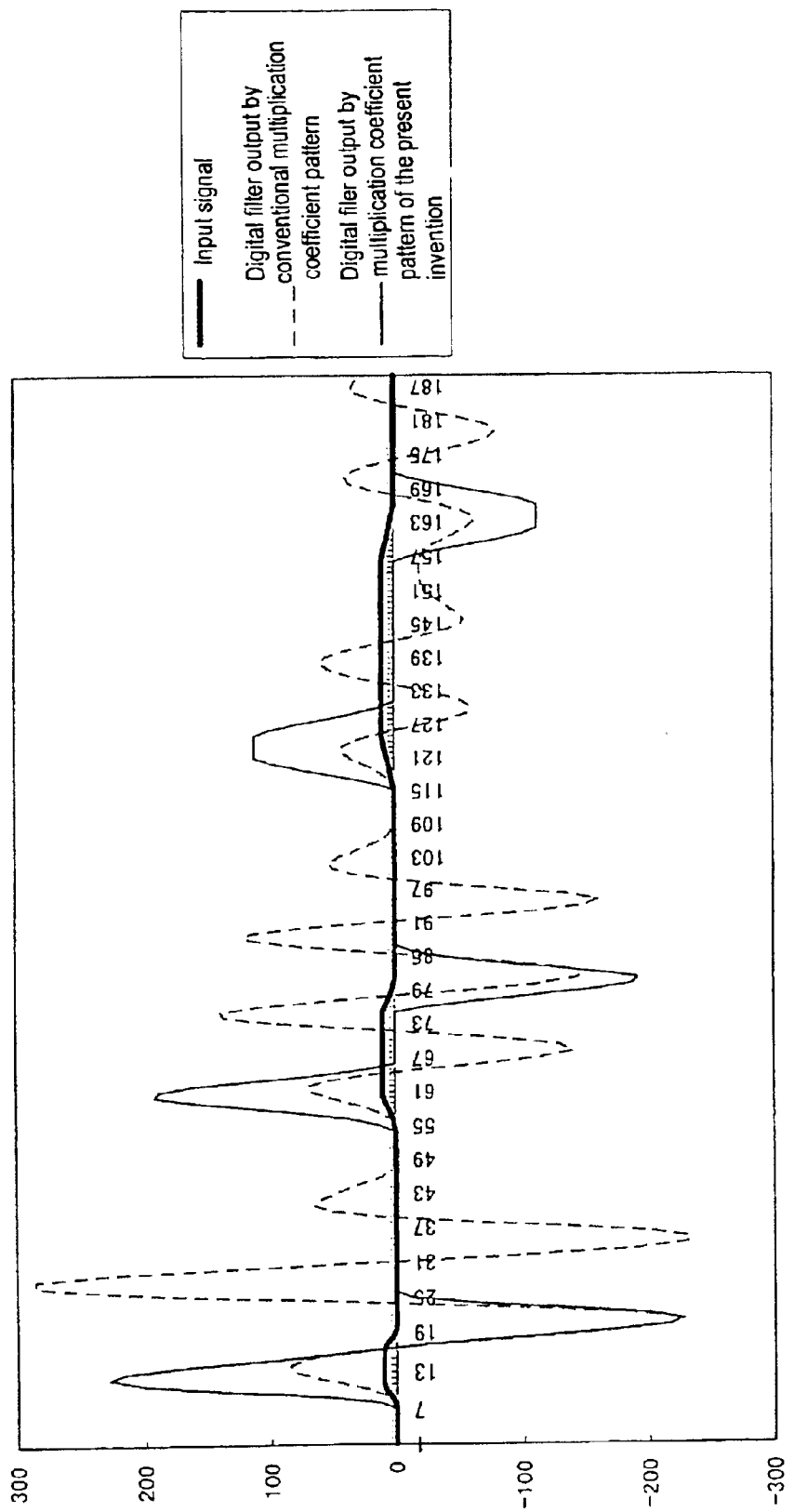
FIG. 12 is a graph showing digital filter outputs where a conventional multiplication coefficient pattern and a multiplication coefficient pattern by means of the present invention are applied to the input signals for testing shown in FIG. 9.

A conventional multiplication coefficient pattern and the multiplication coefficient pattern of the present invention are applied to the input signals for testing shown in FIG. 9. The resultant digital filter outputs are shown in FIG. 12. Time is calculated for each clock. The input signal moves one tap for each calculation in the delay memory. With the conventional pattern, the output waveform repeats vibration while the pattern by means of the present invention generates one pulse-like waveform for each change in inputs.

As described above, the present invention significantly decreases the number of taps of a digital filter to be used, reduces the information processing workload, improves delay in detection of change in inputs, and facilitates determination because the outputs are single pulses.

Figure 11:
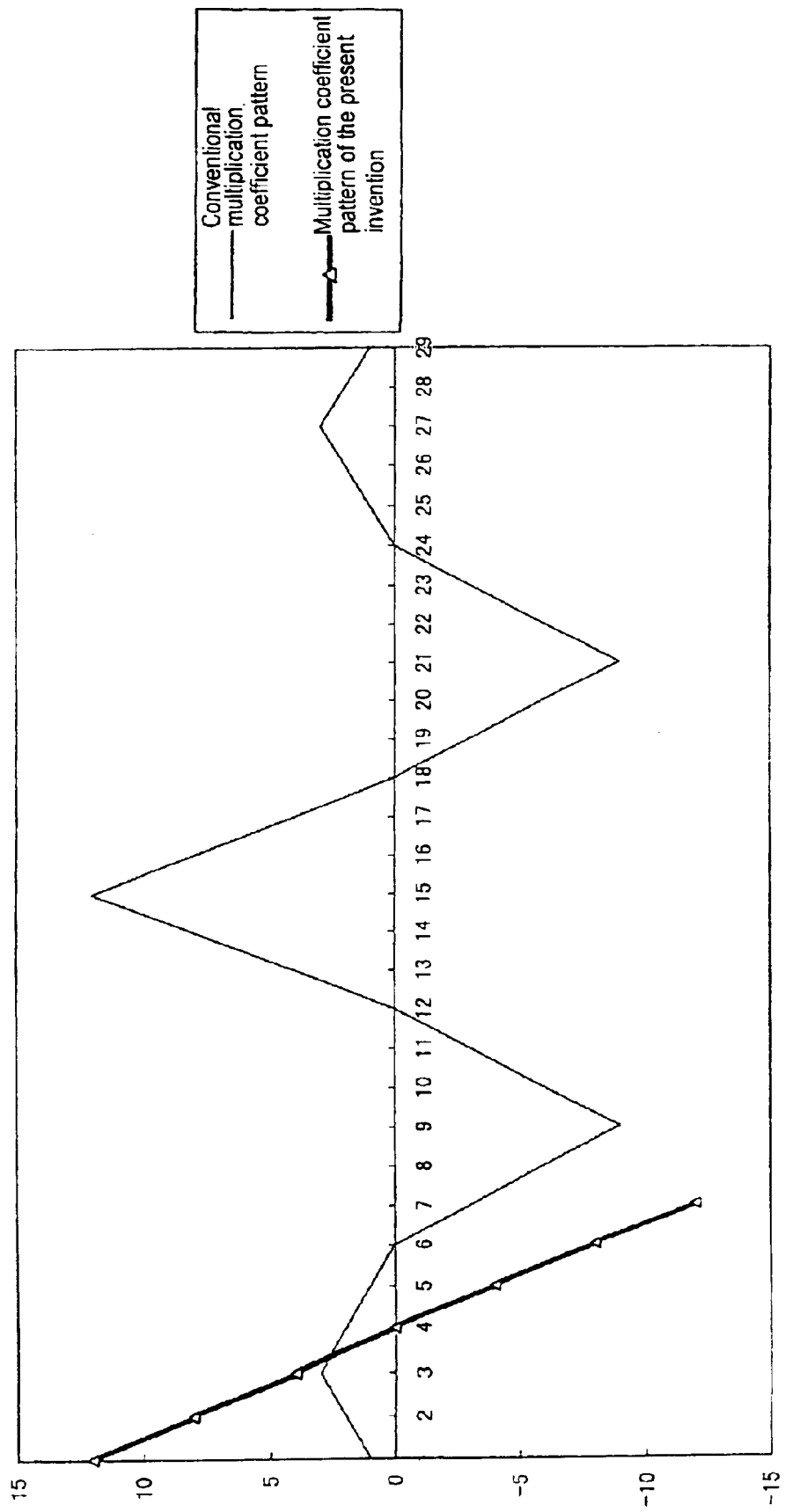
FIG. 11 is a graph showing a comparison of multiplication coefficient patterns for testing between a conventional technique and the method by means of the present invention.

The multiplication coefficient pattern of the present invention shown in FIG. 11 is synthesized from two elemental patterns in the procedure described below. The two elemental patterns shown in FIGS. 13A and 13B are synthesized with a time delay equal to time (=number of taps) ta to derive a differentiation characteristic pattern shown in FIG. 13C. In like manner, a pattern shown in FIG. 13D is derived with a time delay smaller than time ta. Delaying the time (=number of taps) by a certain value is equivalent to outputting data after temporarily storing in phase memory for a certain time period.

Pre-synthesis of elemental patterns and synthesis of outputs are described below as shown in FIG. 14.

Figure 14A:
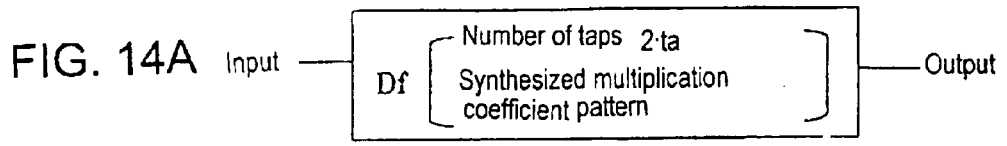
FIGS. 14A–14C are block diagrams showing comparison of pre-synthesis of elemental patterns and synthesis of outputs.
Figure 14B:
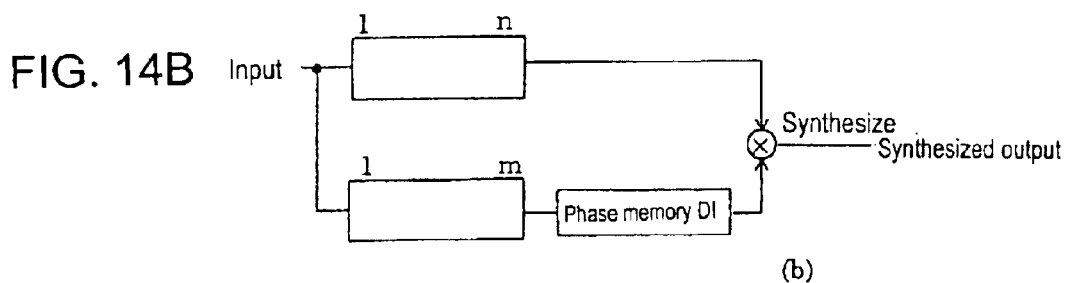
Figure 14C:
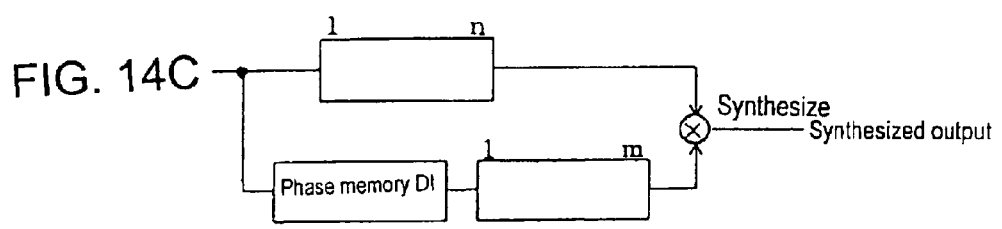
Figure 15:
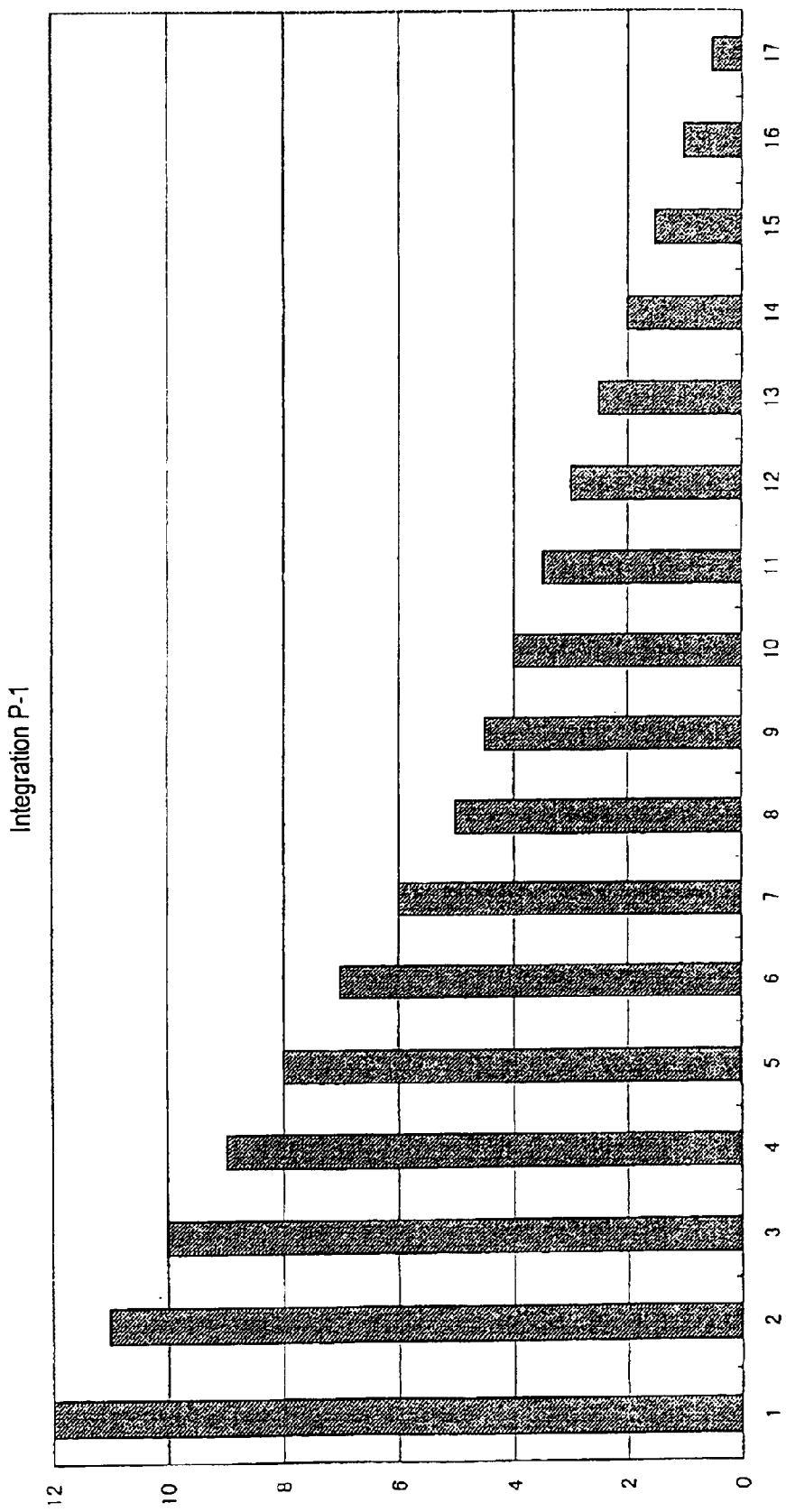
FIG. 15 is a graph showing multiplication coefficient patterns (integration P−1)

FIG. 14A describes pre-synthesis of elemental patterns for setting a single multiplication coefficient pattern. FIGS. 14B and 14C illustrate the synthesizing of outputs. In this case, a phase memory DI is provided on either the input or output of digital filters Dfs that have elemental patterns. The results are identical for all three cases of FIGS. 14A, 14B, and 14C. The multiplication coefficient pattern shown in FIG. 15 is a synthesis of the two patterns of tilt 0.5 and length 8 and 17, respectively. The two patterns are synthesized using the procedure described in FIG. 13.

Figure 16:
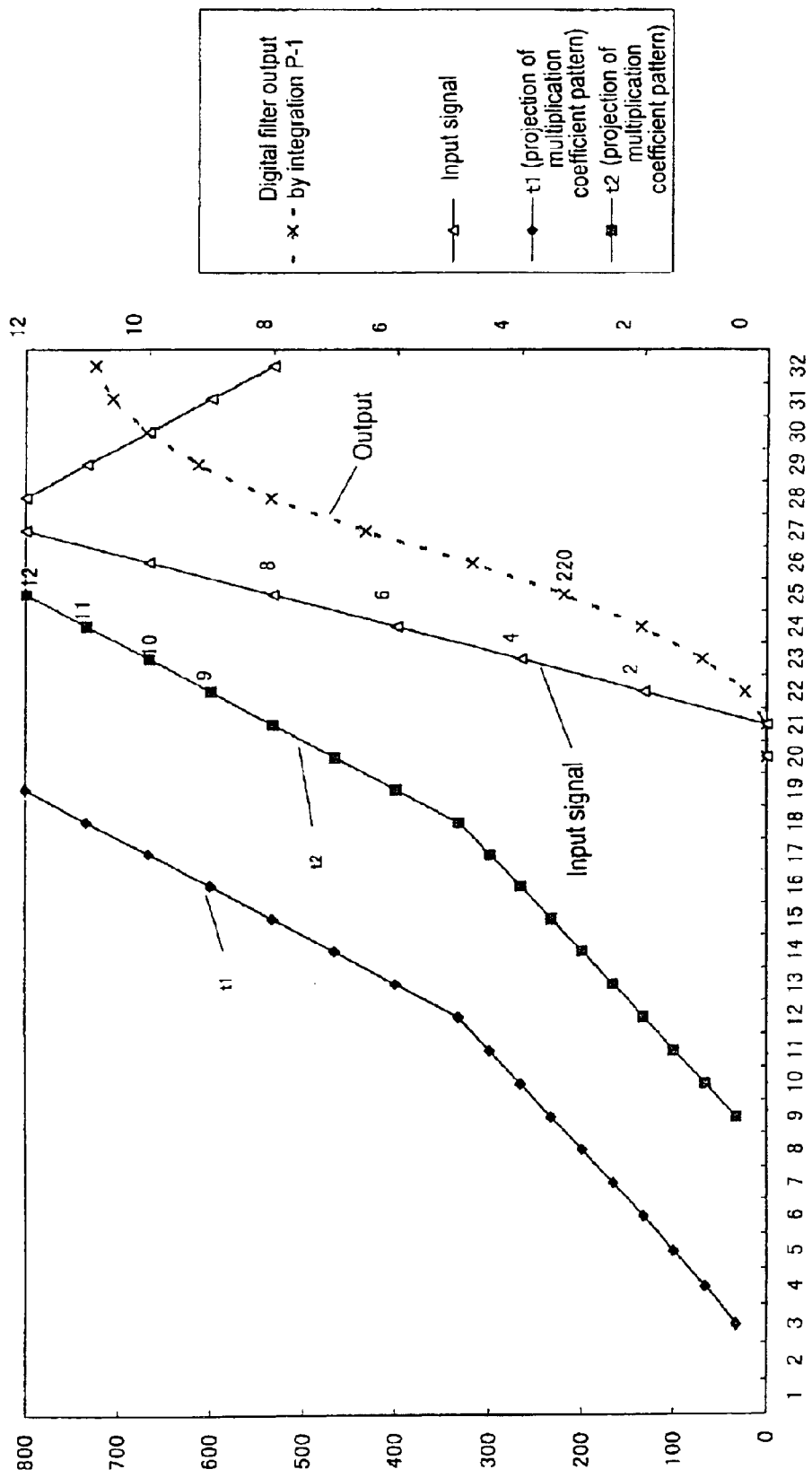
FIG. 16 is a graph of process to characterize the shape of pulse-type input signal waveforms using a synthesized pattern.

FIG. 16 describes the process for characterizing pulse-like input signal waveforms using the above synthesized patterns. Waveforms t1 and t2 are not actual waveforms but are plotted by projecting the multiplication coefficient patterns on two drawings overtime. The digital filters Dfs capture input signals sequentially. This is equivalent to the multiplication coefficient patterns moving to the right sequentially in FIG. 16. The position of the right-hand edge of the pattern represents the most recent input to the digital filter. At t1, input signals are zero, and no way to perform multiplication. At t2 multiplication is made at four points. The sum is 220 at the output.

Figure 17:
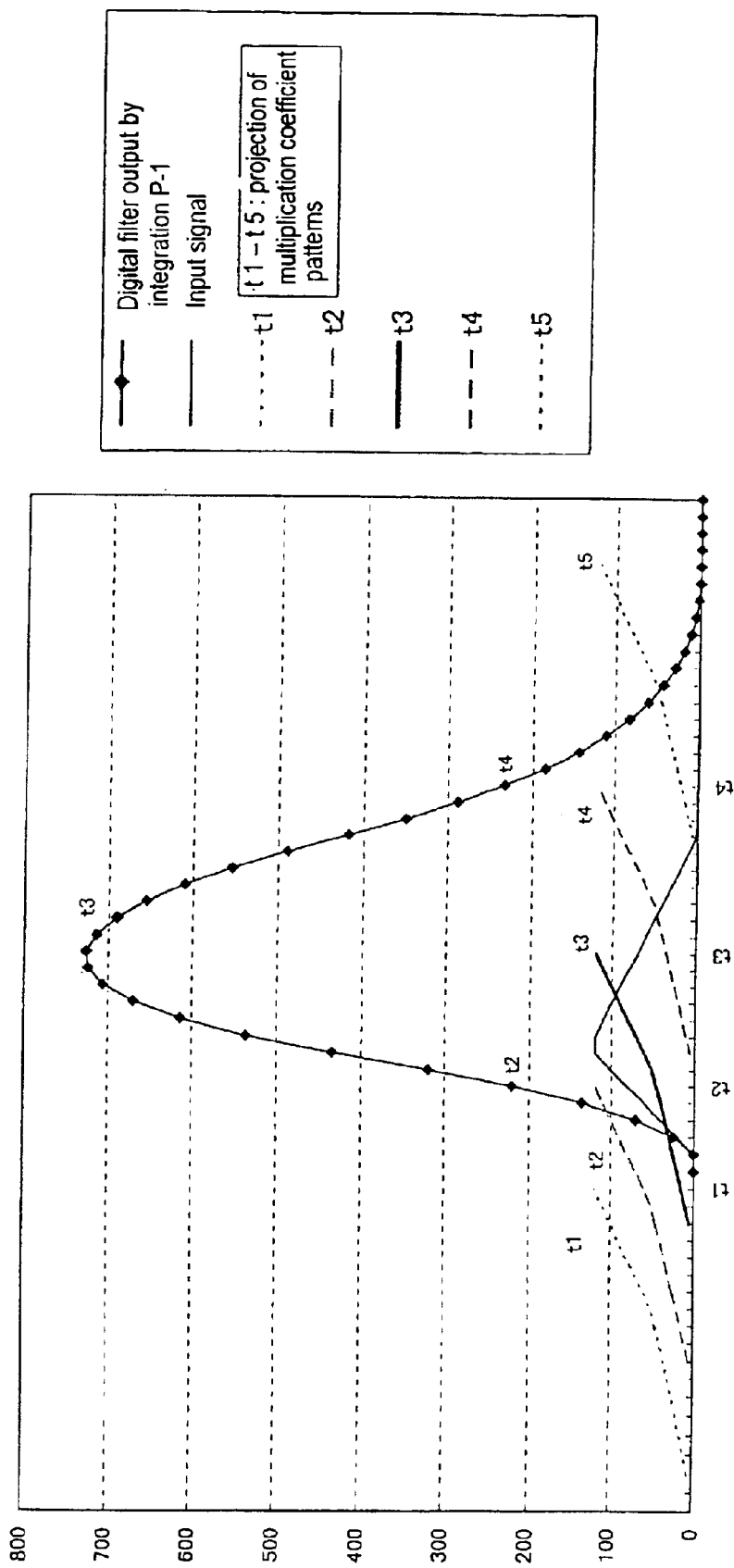
FIG. 17 is a graph showing continuous plot of FIG. 16.
Figure 18:
FIG. 18 is a graph showing a negative integrated characteristic pattern.
Figure 19:
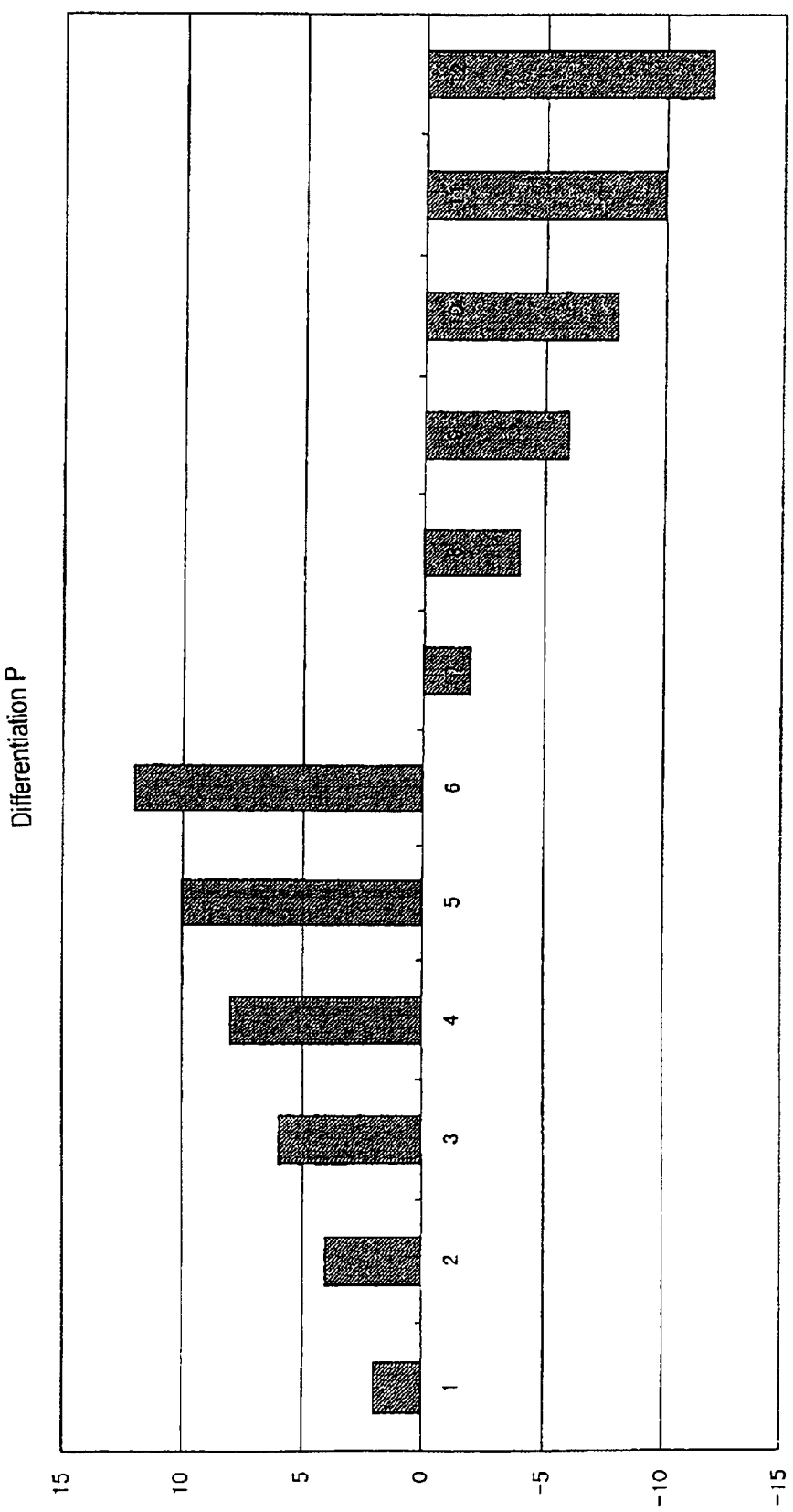
FIG. 19 is a graph showing a differentiated characteristic pattern of a special shape.

FIG. 17 shows continuous plotting of the outputs shown in FIG. 16. Given this particular relationship between the multiplication coefficient pattern and input signals, the sum of products with the multiplication coefficient patterns peaks a little after the input peaks. This is because the input rise interval is short. In like manner, we generate a negative integration characteristic pattern (FIG. 18) and a differentiation characteristic pattern of a special shape (FIG. 19). Using these three synthesized patterns, we identify the four waveforms shown in FIG. 20 using the procedure described below. The characteristic patterns each with a unique characteristic respond differently to the shape of input waveforms. The combination used for identification must be carefully prepared after understanding which pattern becomes large on a sharp rise of an input or by using other characteristics.

Figure 20:
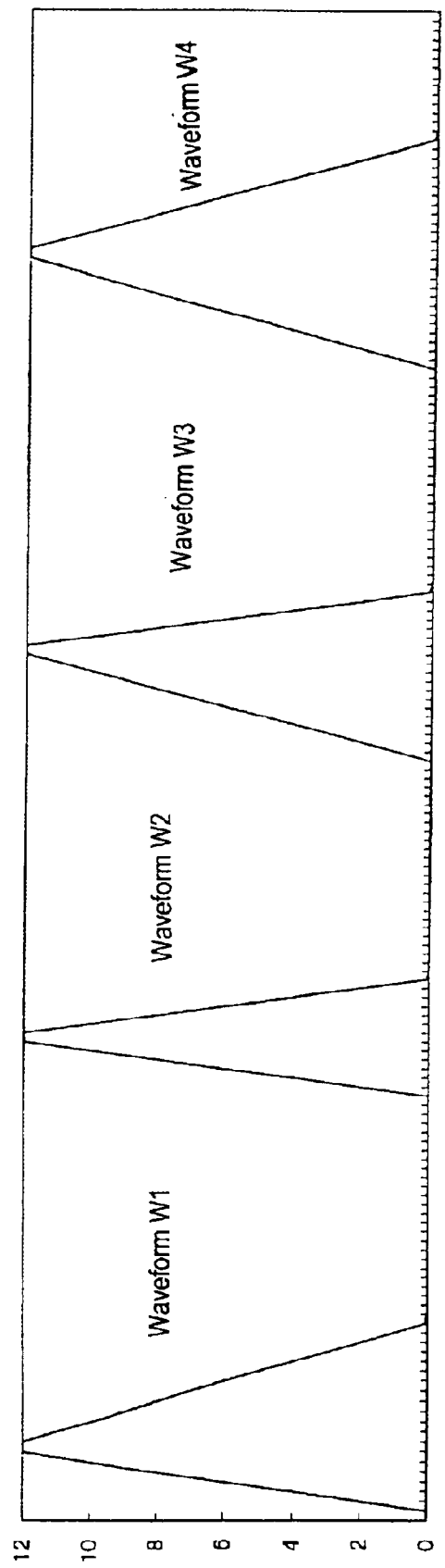
FIG. 20 is a graph of four input waveforms for testing.
Figure 21:
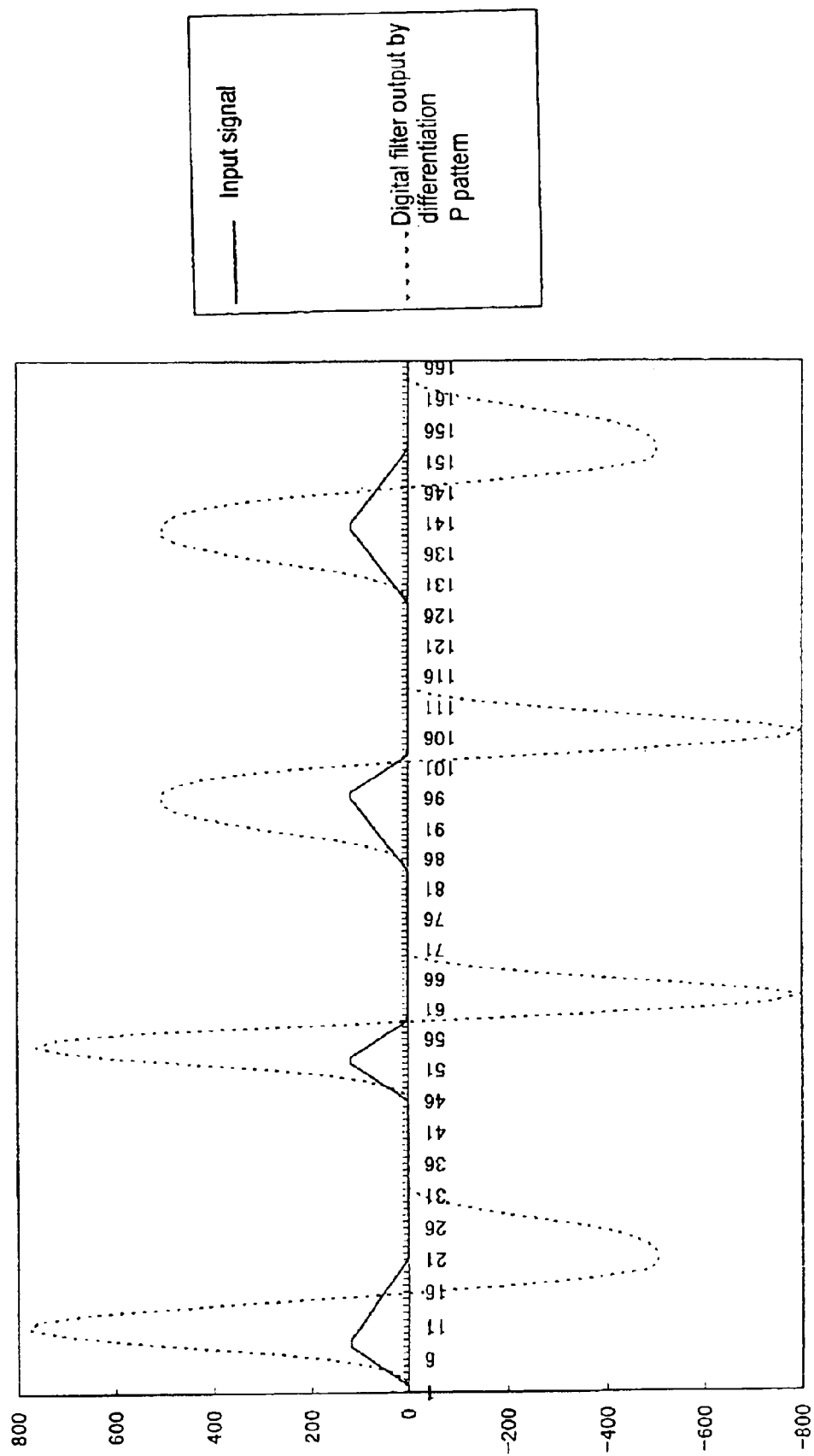
FIG. 21 is a graph showing that digital filter outputs are derived from input signals shown in FIG. 20 using the differentiated characteristic pattern shown in FIG. 19.
Figure 22:
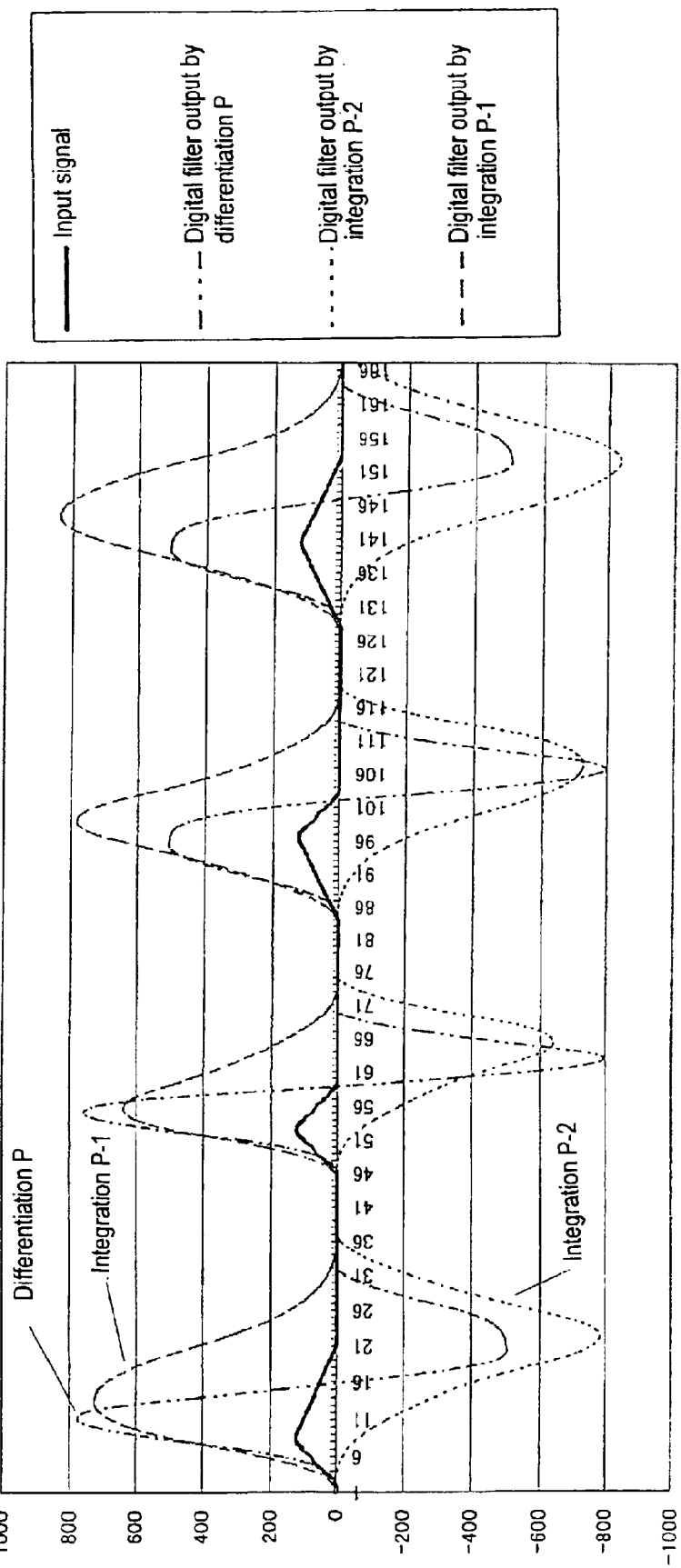
FIG. 22 is a graph showing the difference of outputs from the three characteristic patterns.

Using the differentiation characteristic pattern shown in FIG. 19, we characterized the input signals shown in FIG. 20. The result is given in FIG. 21. As is clear from FIG. 21, the output is sharp and strong for a sharp rise or fall with a large tilt. The difference of outputs was tested on the three characteristic patterns as shown in FIG. 22. The outputs from these three characteristic patterns are named integration P-1 (pattern), integration P-2 and differentiation p, respectively. Possible combinations can use time lag and inversion of signs for waveforms. The latter is equivalent to shifting the-phase by 180 degrees, and thus both are phase operations.

Figure 23:
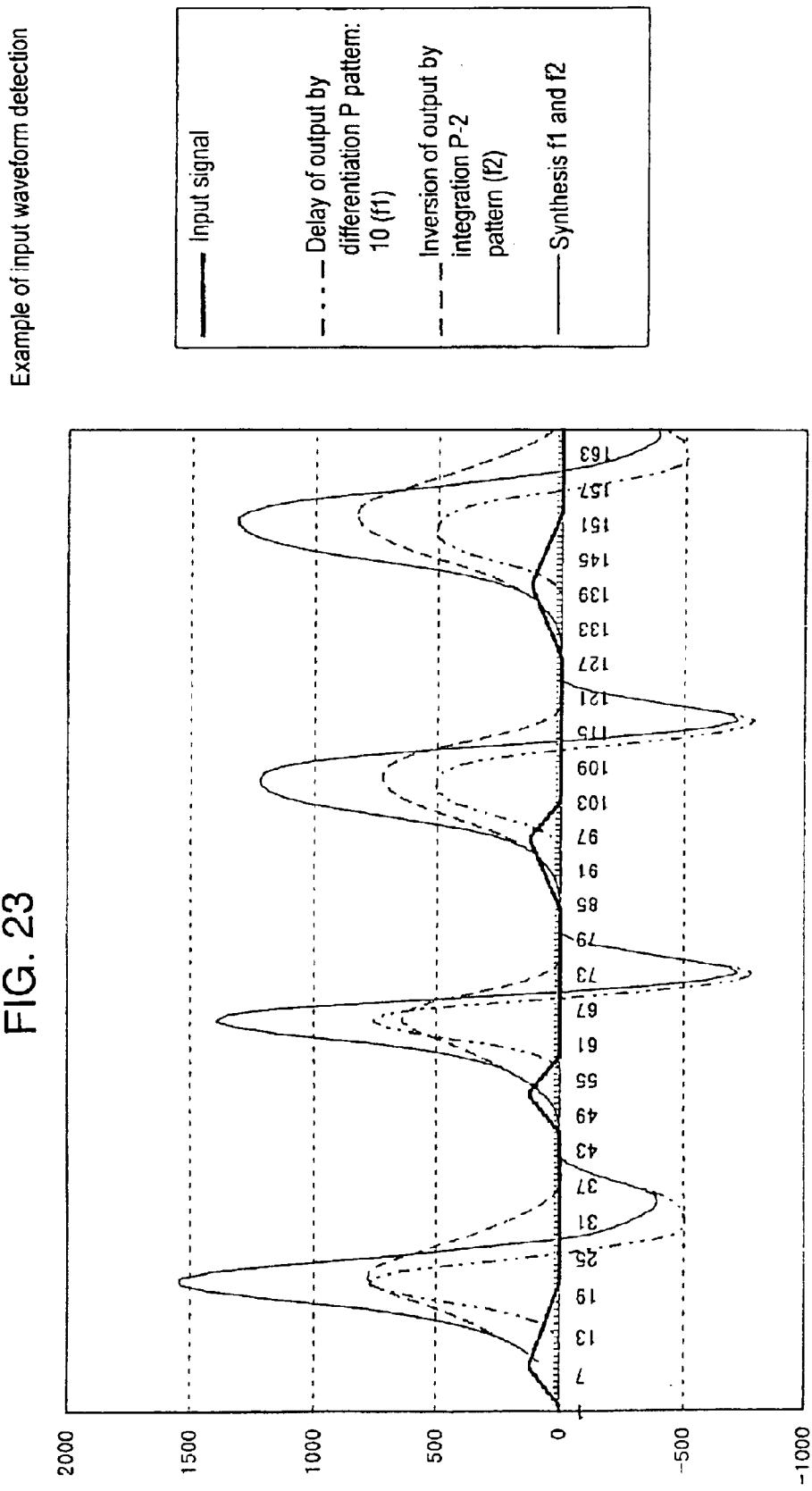
FIG. 23 is a graph showing that-outputs of integration P−2 shown in FIG. 22 are synthesized after inverting the sign to identify input waveform 1 shown in FIG. 20.
Figure 24:
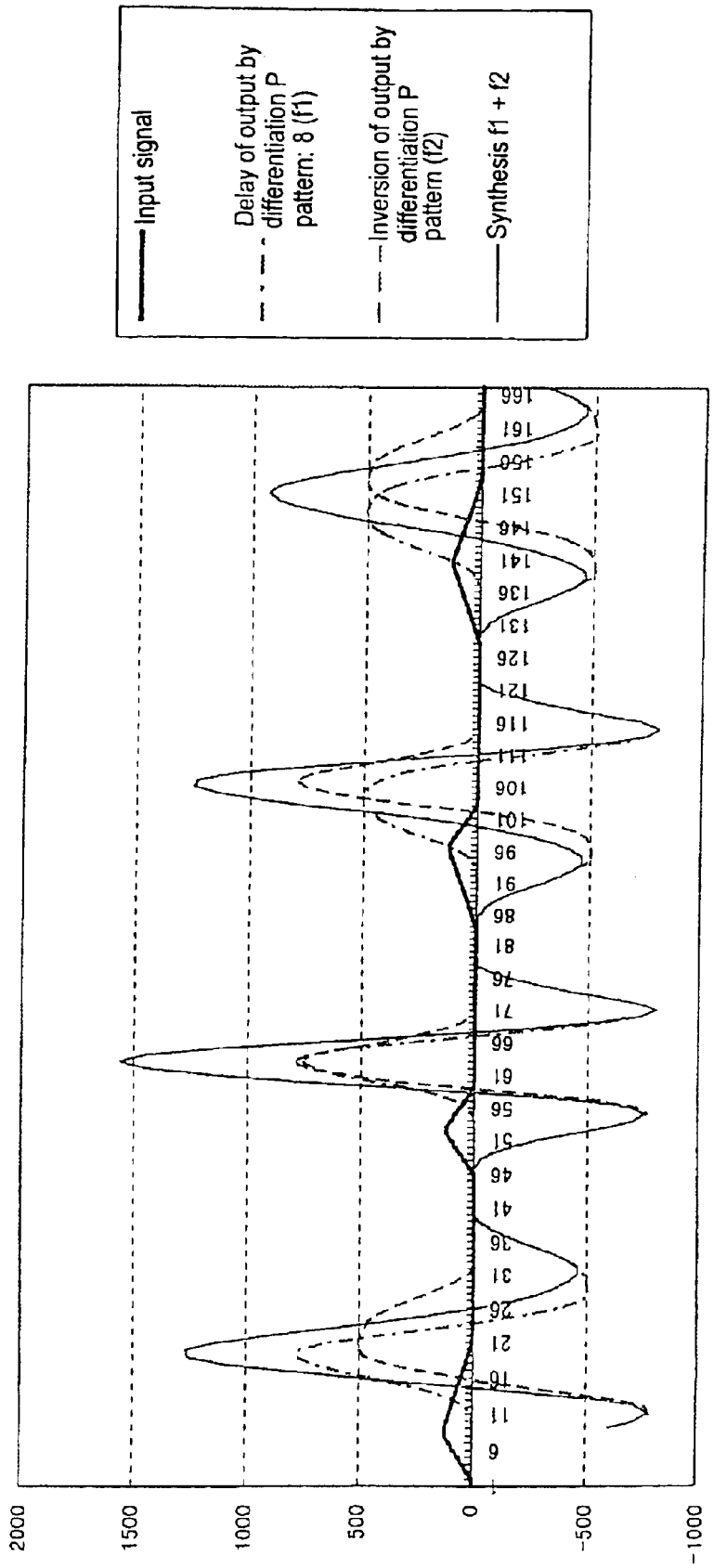
FIG. 24 is a graph showing that outputs of differentiation P are delayed by 8 and the sign of the negative peak of differentiation P is inverted before synthesis to identify input waveform 2 shown in FIG. 20.
Figure 25:
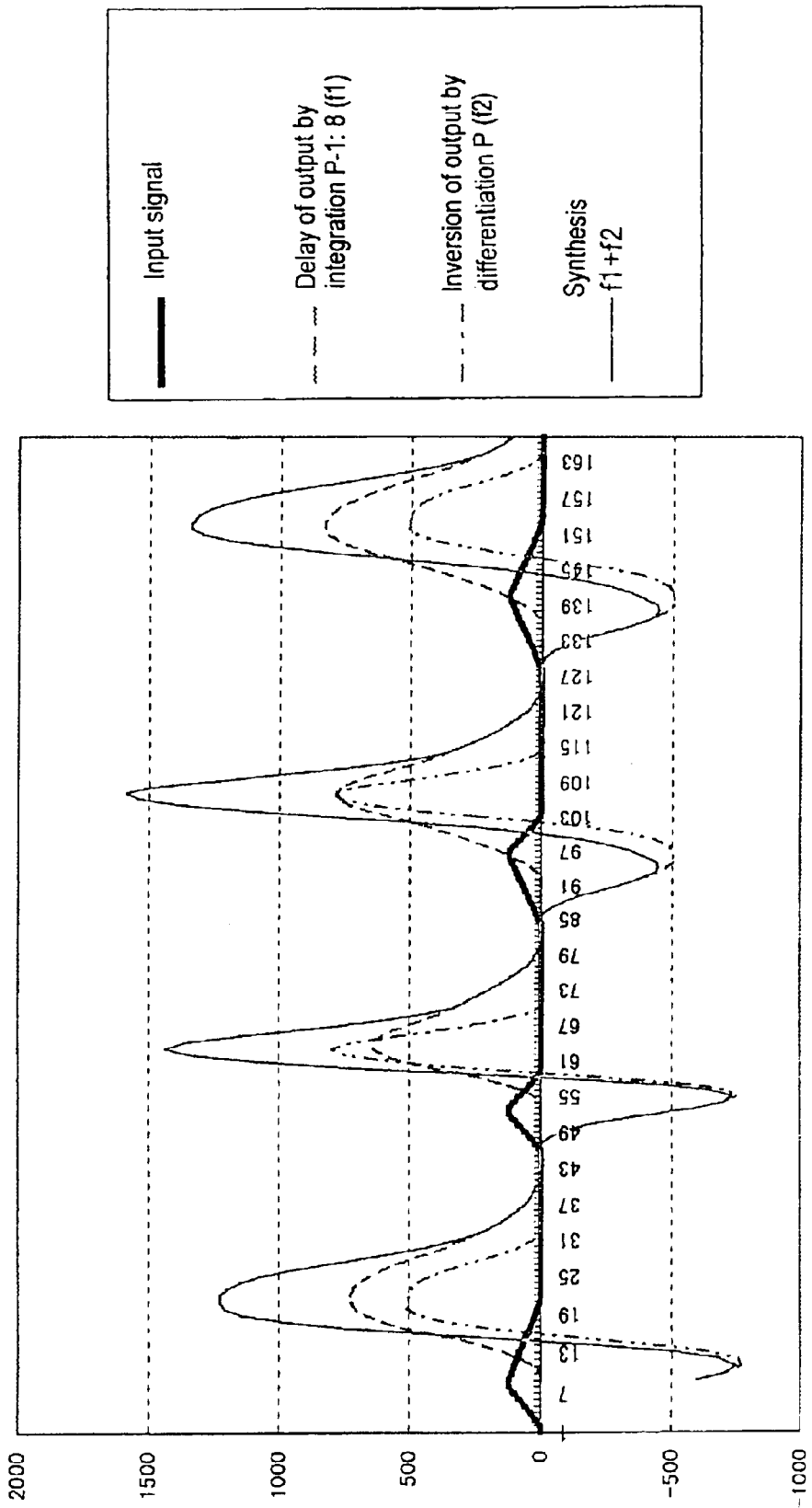
FIG. 25 is a graph showing that outputs of integration P−1 are delayed by 8 and the sign of the negative peak of differentiation P is inverted before synthesis to identify input waveform 3 shown in FIG. 19.

In FIG. 22, to identify input waveform WF1, we need to delay the application of differentiation P that characterizes the rise of input waveforms by 10 (a time equivalent to 10 taps), invert the sign of integration P-2 that generates a high output at a gentle fall and synthesize both patterns. As a result, we derive an output that is the largest for input waveform WF1 as shown in FIG. 23. To identify input waveform WF2, we delay differentiation P by 8 (an 8-tap equivalent time), invert the negative sign of peak of differentiation P, and synthesize both patterns. The result is shown in FIG. 24. In like manner, to identify input waveform WF3, we delay integration P-1 by 8 (an 8-tap equivalent time), invert the negative sign of peak of differentiation P, and synthesize both patterns. The result is shown in FIG. 25.

The function for identifying input-signal waveforms WF1 through WF4 is shown in FIG. 26. The digital-filter output (Normal: N) indicates a normal output. Output (Invert: I) is an inverted output. The function for detecting waveform WF4 in FIG. 26 is not required if there is no other waveform to be detected, besides waveforms WF1 through WF4. All the above descriptions assume the synthesis of two digital filter outputs-at the synthesizer or 1:1 synthesis of delay outputs.

Figure 27:
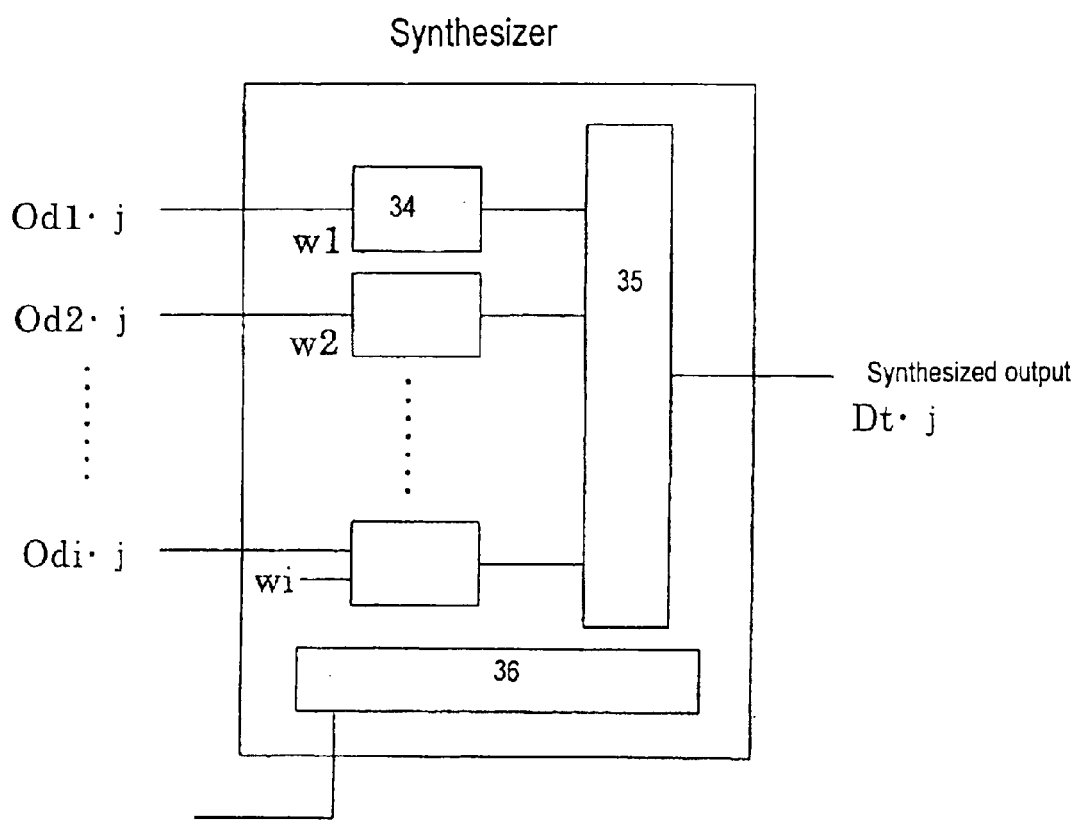
FIG. 27 is a block diagram showing derivation of weighted average in creating a synthetic output.

If it is found that some patterns are effective at discerning features while the others make little contribution, a proportional weight is given to them before synthesizing the patterns. This is described below as shown in FIG. 27. It is also possible to reduce all characteristic patterns to elemental patterns, and synthesize them with phase matching (delay of output, inversion, etc.) of multiple filters incorporating elemental multiplication coefficient patterns. Synthesized weight patterns are used to calculate the weighted average of digital filter outputs or their delay outputs $Odi-j$ after delay processing. Delay outputs $Odi-j$ are multiplied by weight wi, and all results are summed and then divided by the sum of weights $w1+w2+w3+w4 \ldots wi=\Sigma(wn)$ (n=1 to i).

The use of weight varies with programs. Weighting may be used in summing where a weight is simply multiplied to derive the sum. It may also be used in processing geometrical average.

Figure 28:
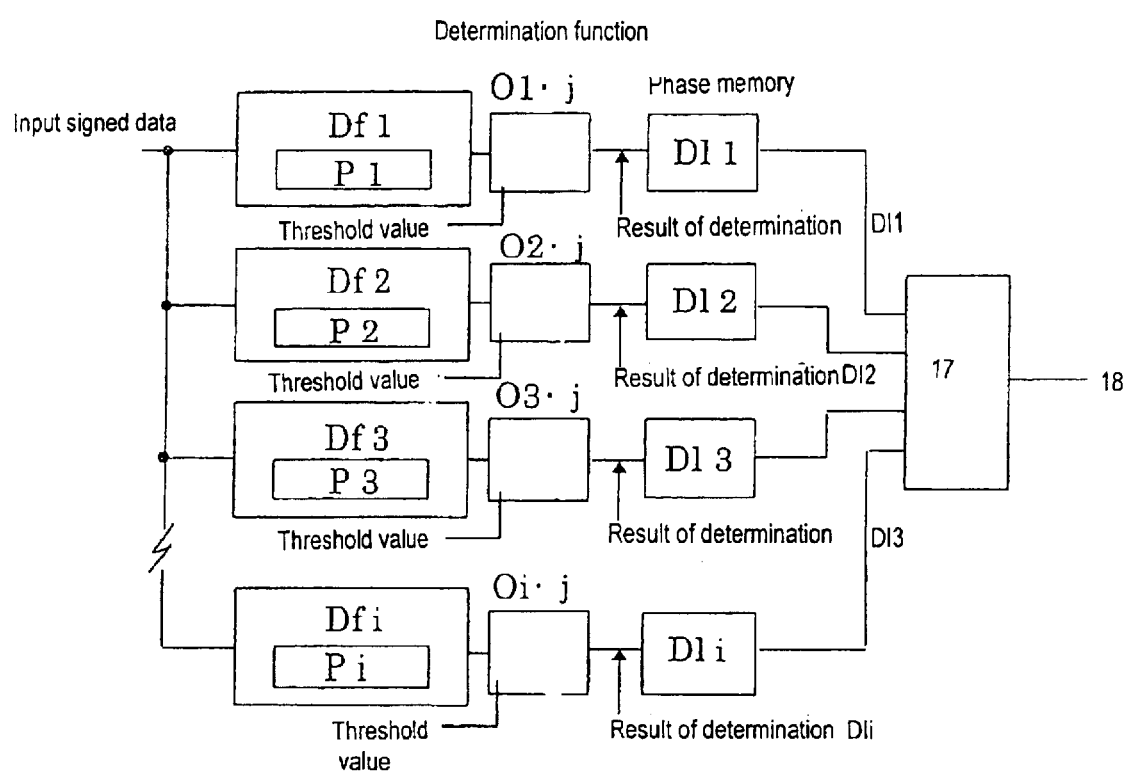
FIG. 28 is a block diagram showing a partial view of the determinator.

A determinator function may also be provided to determine the digital filter outputs $O1·j$ through $Oj·j$ individually before determining fused and synthesized output at the determinator 20 as shown in FIG. 28. When the waveform of input signal is a series of significant signals such as phoneme and radio wave signals, the phoneme and signals may be characterized; the phoneme is determined after checking the size with threshold values; the results are temporarily stored in a phase memory DI; the data are timed with the result of determination of next phoneme and signals; and the data are synthesized for final determination. In such an application as well, a phase memory DI may be positioned at the input of the digital filter calculator 13 to derive the same effects.

The waveform detection system of the present invention is constructed as stated above. It is compared with a conventional wavelet waveform detection system below. As shown in FIG. 29A, the multiplication coefficient pattern A is a conventional wavelet multiplication coefficient pattern while the pattern B shown in FIG. 29B is a multiplication coefficient pattern by means of the present invention. Patterns A and B are applied to the same input signals and the outputs are obtained. The result is shown in graphs G1 and G2 in FIG. 29C. The first graph shows the input signals, that is, detected radio waves. The sharp peaked pulse near the center is noise. Small peaked waveforms on the right and left hand side are the waveforms to be extracted. The performance of a detector is determined by its ability to ignore the central noise and highlight the target waveforms.

Graphs G1 and G2 show the result of the detection using a conventional wavelet method and using the present invention, respectively. Both succeed in detecting the target waveforms despite the noise, but detection using the conventional system is considerably delayed. When using digital filter outputs derived from the multiplication coefficient pattern B that is assimilated only to the tilt of waveforms to be detected, instead of pattern A, the delay in detection is reduced to approximately one-half that when using pattern A. This means that a multiplication coefficient pattern of a simple form increases throughput. With pattern B, it is possible to change the number of taps and integration parameter n in such a direction that output errors decrease on changing the tilt of the pattern. This means that a learning system can easily be developed to perform automatic adjustments. It is obvious that changing and adjusting the shape is quite difficult with pattern A.

Figure 30:
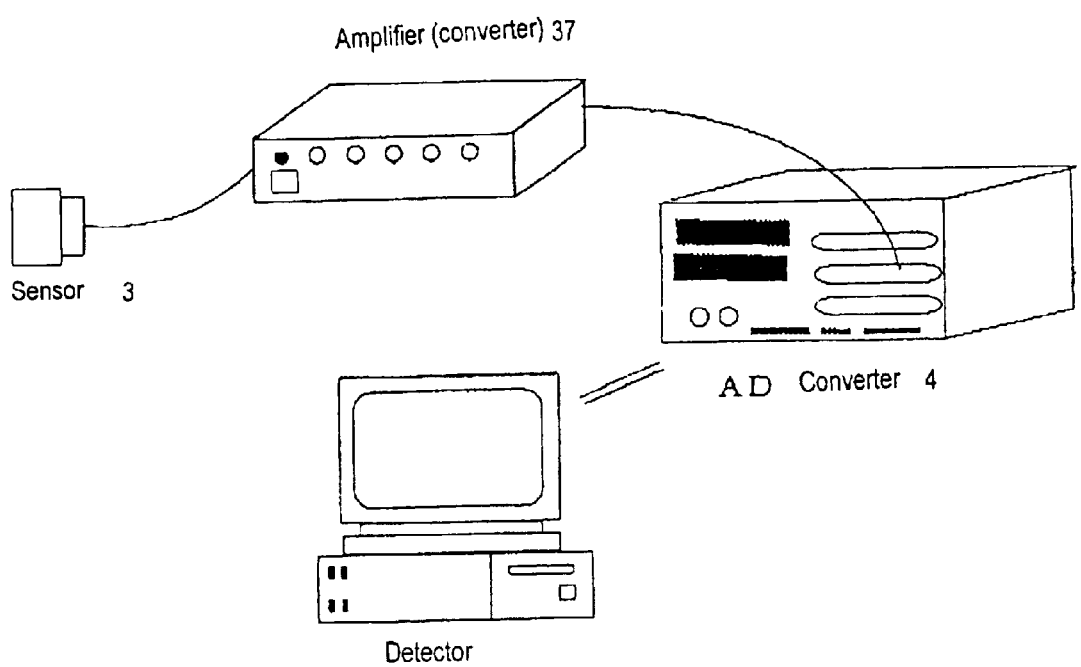
FIG. 30 is a block diagram showing a waveform detection system of the present invention applied to a state-monitoring system.

An example of an application of the above waveform detection system 10 to a state-monitoring system is described below as shown in FIG. 30. The state-monitoring system has the structure shown in the figure. Detection signals from the sensor 3 are input into the waveform detection system 10 via amplifiers 37 and A/D converter 4, and are computed and processed. The system performs, for example, predictive diagnosis for pressure waveforms at pressure transfer pipes that may become clogged with radioactive substances. Changes in pressure waveforms are captured at the waveform detection system (detector) to monitor the state of clogging in FIG. 31D, the input signals are pressure waveforms. Peak P1 is a normal waveform, and peak P2 an anomaly precursor waveform. The conventional multiplication coefficient pattern A shown in FIG. 31A, a graph G1 in FIG. 31D, produces a similar strength of digital filter outputs for peaks P1 and P2, making it impossible to discriminate between them by threshold determination.

Graphs G2 and G3 in FIG. 31D result from the use of the rise and fall characteristic detection multiplication coefficient patterns, respectively. The rise characteristic is identical for both normal and anomaly precursor waveforms so the result is the same. The fall characteristic clearly reveals a difference. When graph G2 is delayed by time td and added to graph G3, the result of the detection of normal waveforms takes all negative values while the result for anomaly precursor waveforms takes predominantly positive values. We can therefore detect the precursor signals. Delaying waveforms and matching peaks is called phase matching, which is another feature of the present invention. The result of detection is displayed by means of a known means, making it clear whether the pressure transfer pipes are clogged or not.

Figure 32:
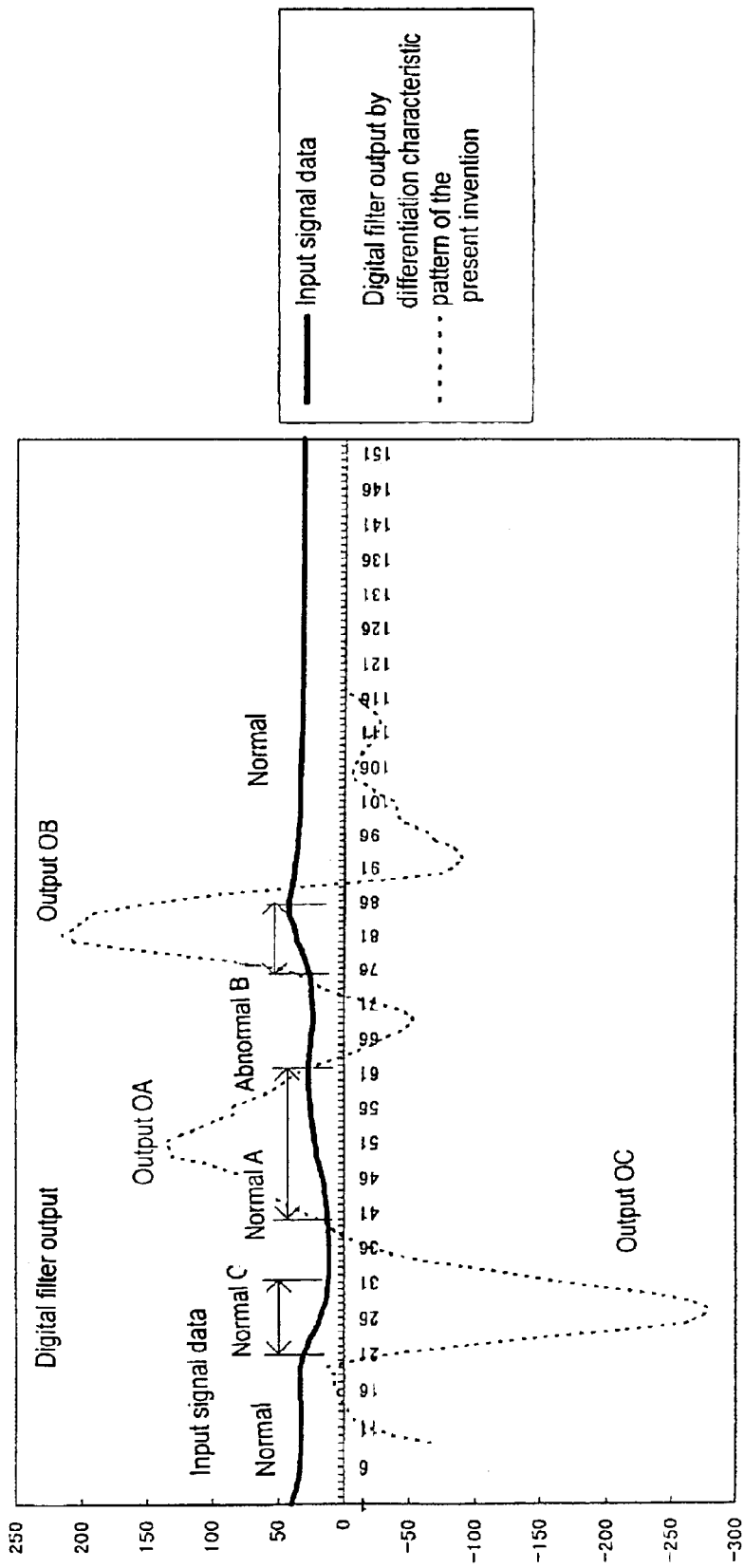
FIG. 32 is a graph showing comparison of digital filter outputs derived from multiplication coefficient patterns used in conventional wavelet methods shown on FIG. 41 and those derived from multiplication coefficient patterns of the present invention.
Figure 37:
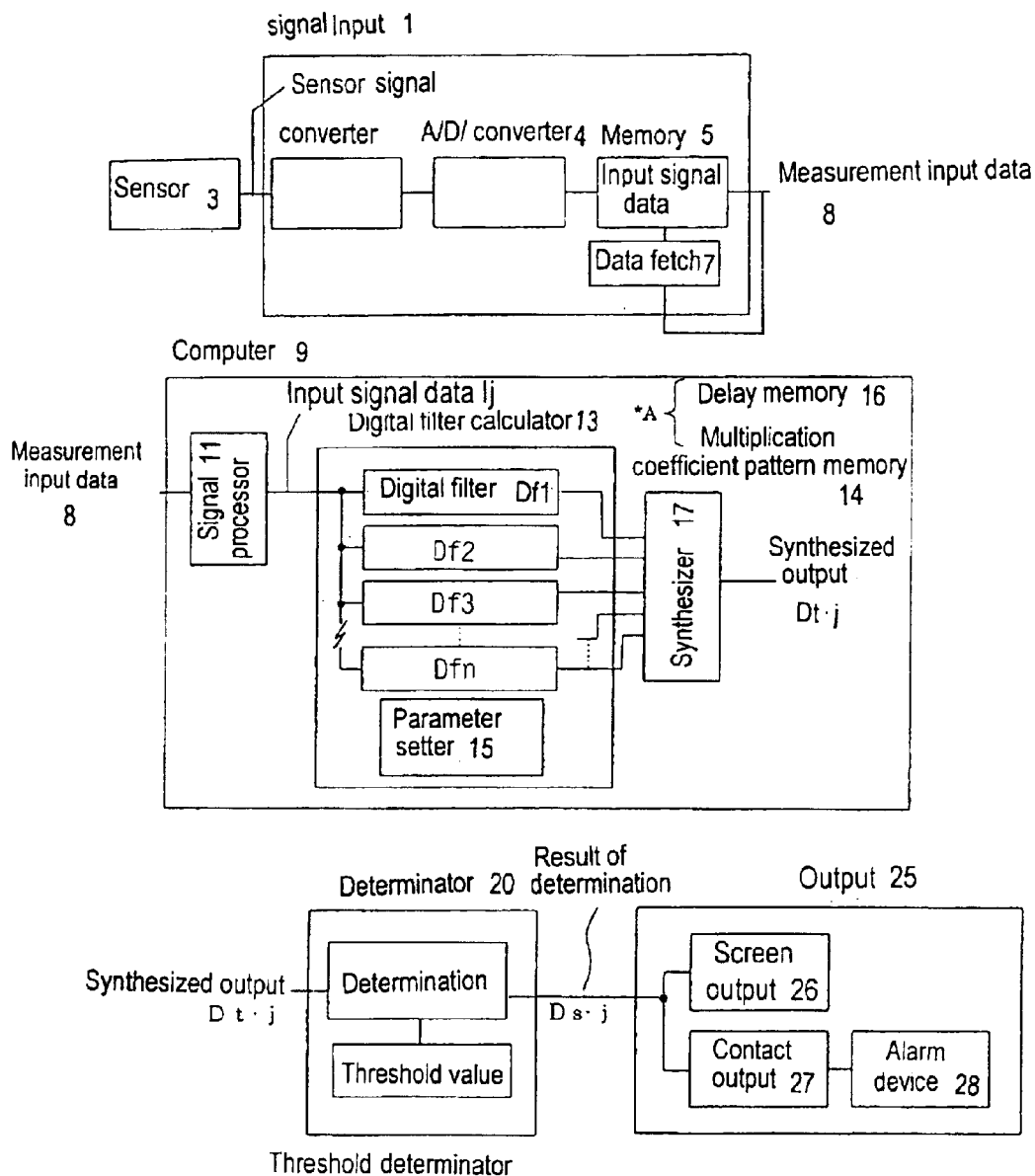
FIG. 37 is a block diagram showing a structure of a conventional wavelet type waveform detection system.
Figure 38:
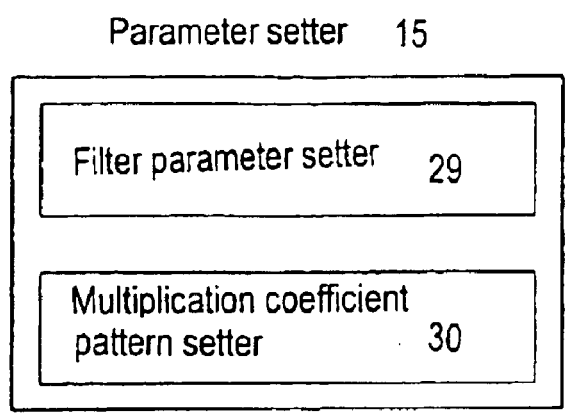
FIG. 38 is a block diagram showing a structure of a conventional parameter setter.
Figure 39:
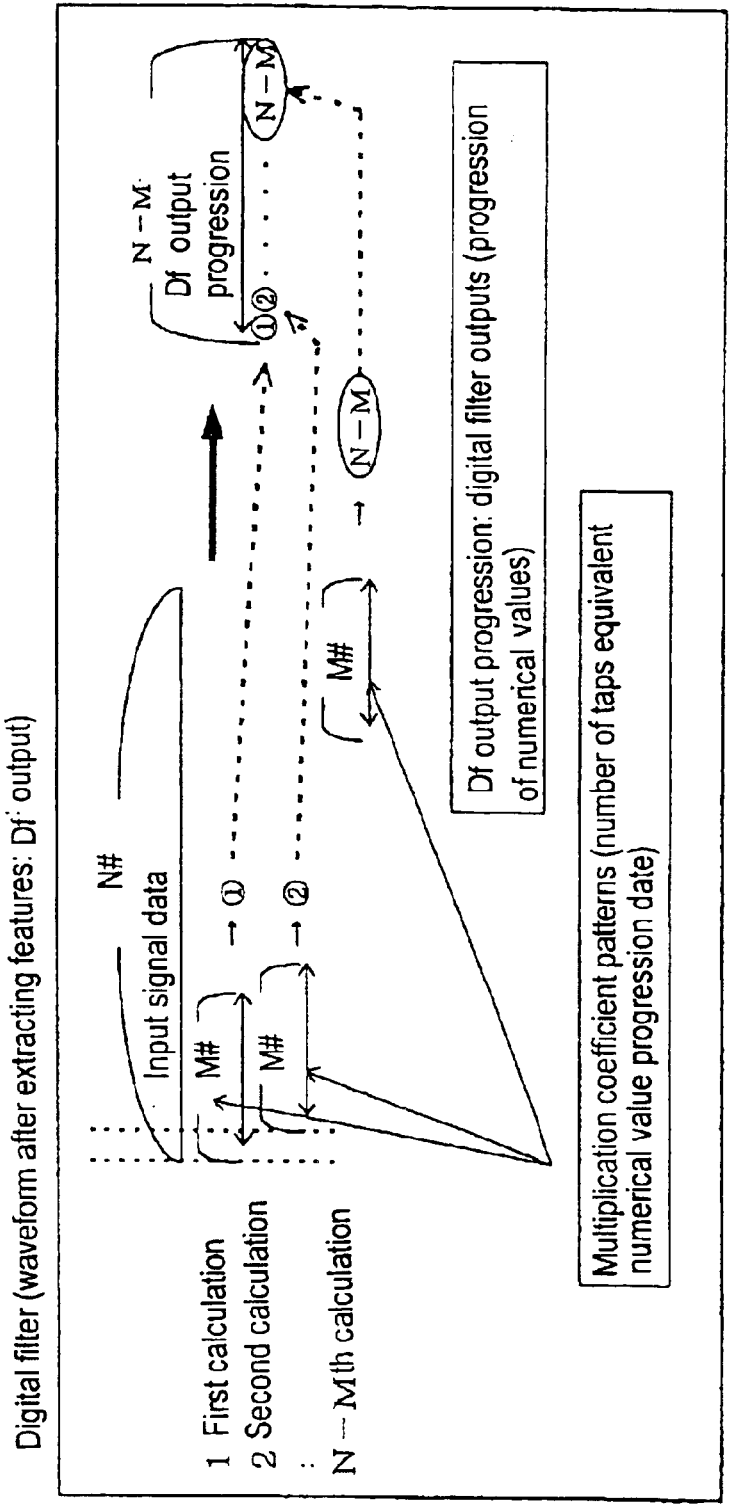
FIG. 39 is an illustration of a general digital filter serving as the base of wavelet calculation.
Figure 40:
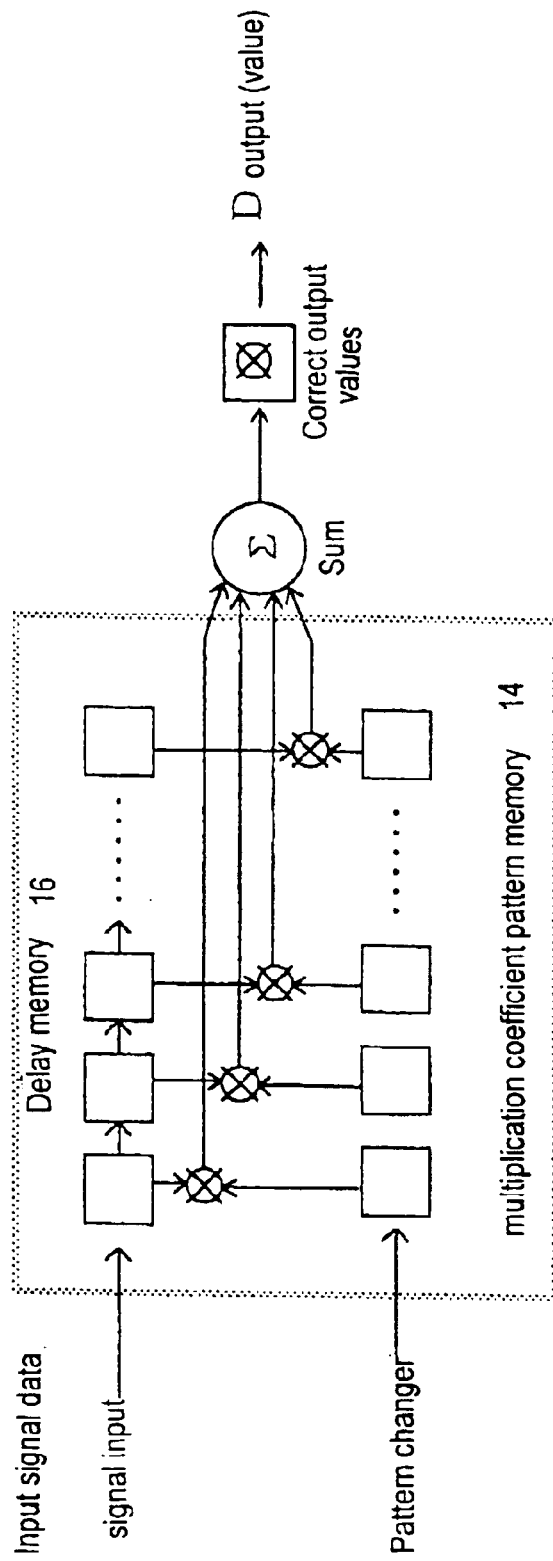
FIG. 40 is a diagram showing a digital filter calculation procedure.
Figure 41:
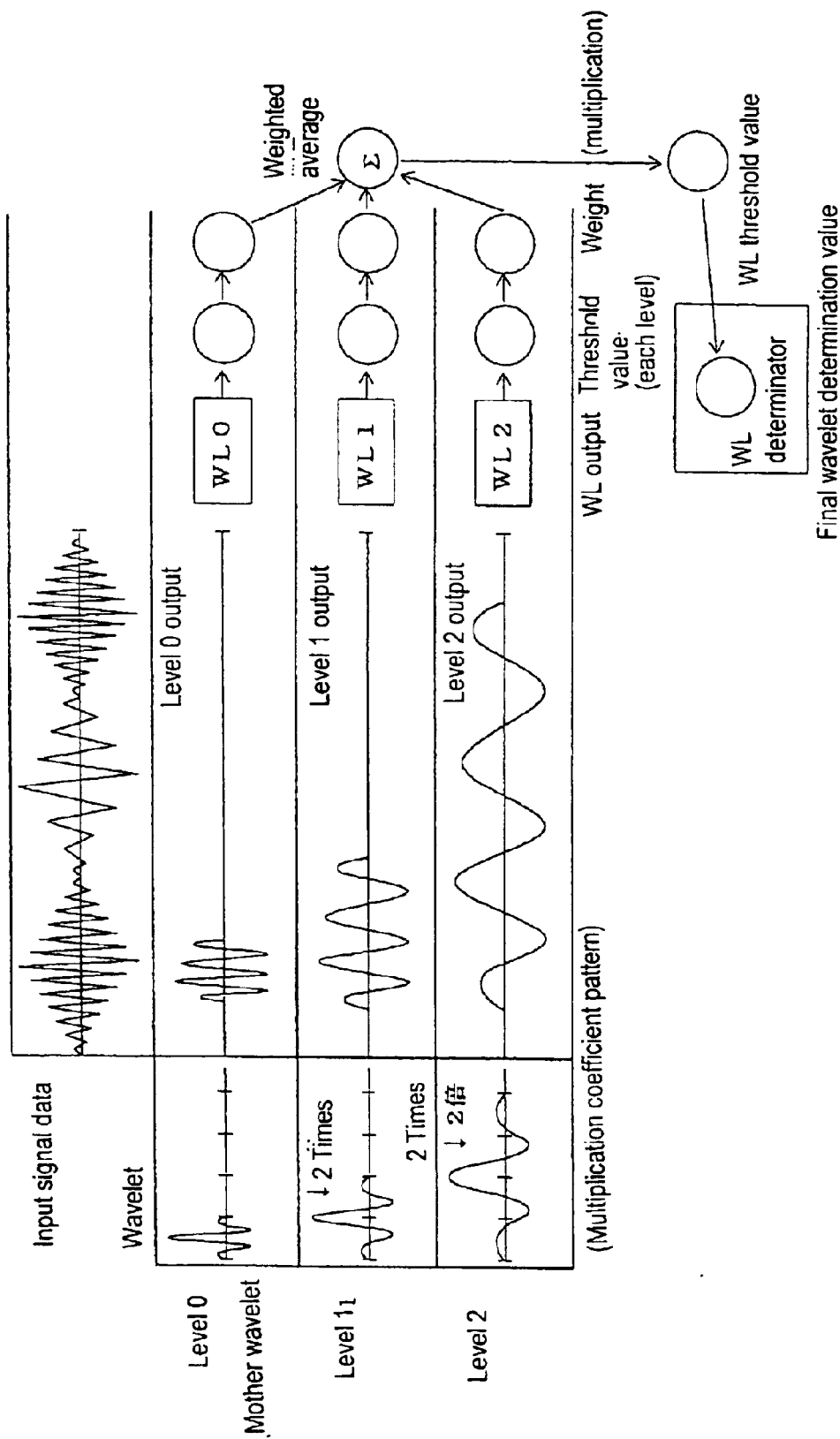
FIG. 41 is a combined graph and diagram showing a conventional wavelet method.
Figure 42:
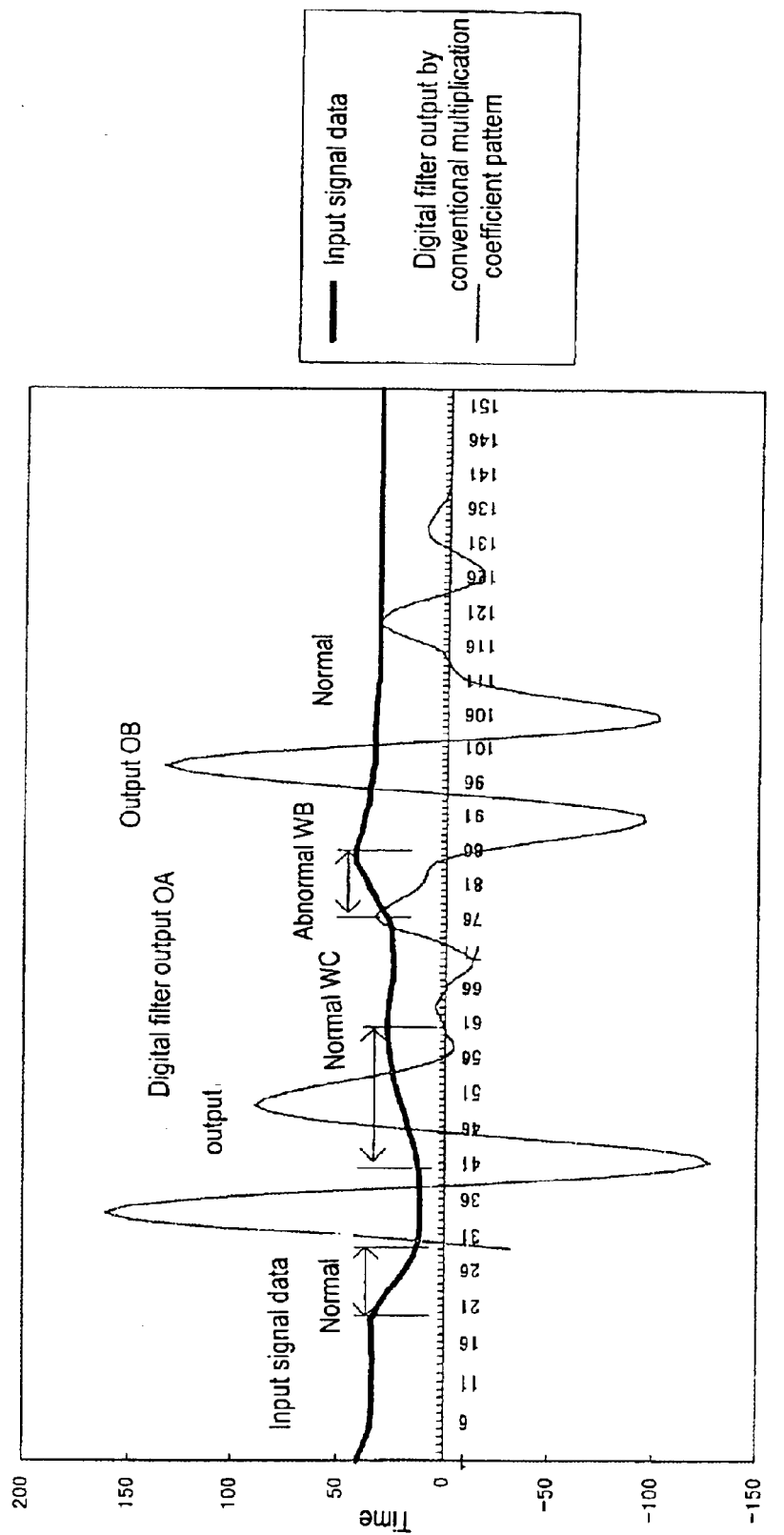
FIG. 42 is a graph showing a n example of deriving outputs from digital filters using multiplication coefficient patterns typically employed in conventional wavelet methods.
Figure 43A:
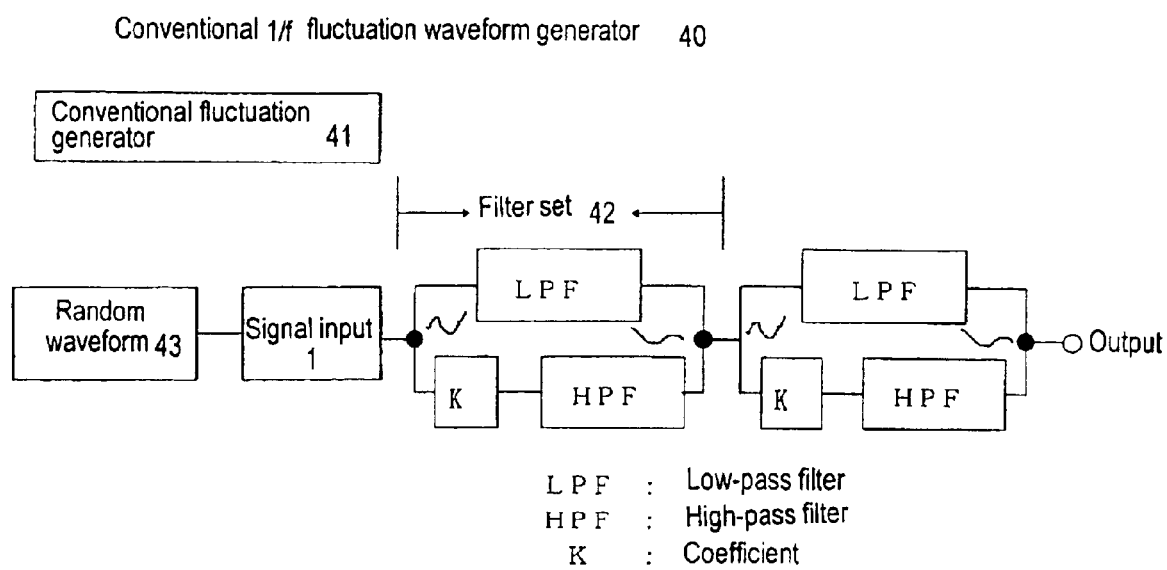
FIG. 43 is a block diagram showing a conventional 1/f fluctuating waveform generator.
Figure 43B:
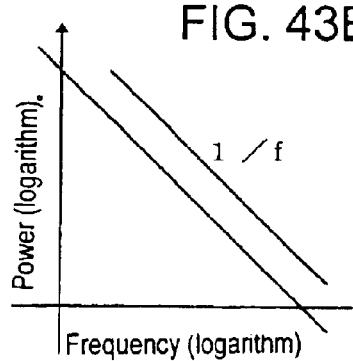

An example of characterization focusing on the undulation of waveforms is shown in FIG. 32. The figure shows the output of digital filters DFs that use the multiplication coefficient patterns of the present invention for the purpose of comparison with the outputs of digital filters Dfs that use the multiplication coefficient patterns typically adopted in conventional wavelet methods. The multiplication coefficient pattern used is a differentiation characteristic pattern. The digital filter Df has 7 taps. As is clear in FIG. 37, and in comparison with FIG. 42, the output for Normal OA, Abnormal OB, and Normal OC sections of undulation of input signals in FIG. 32 is a single pulse-like output. The output for Normal OC is negative and the output for Abnormal OB is the largest of all outputs. Anomalies are detected if the threshold value is set between 130 and 200 at the determinator 22. As is also clear from the figure, the delay of detection is almost insignificant compared with 10 to 20 tap equivalent delay in FIG. 42. Early detection is possible using the present invention.

The structure of the waveform converter to create a known 1/f fluctuation filter is described below. The same known waveform converter hardware is used as is.

Figure 33:
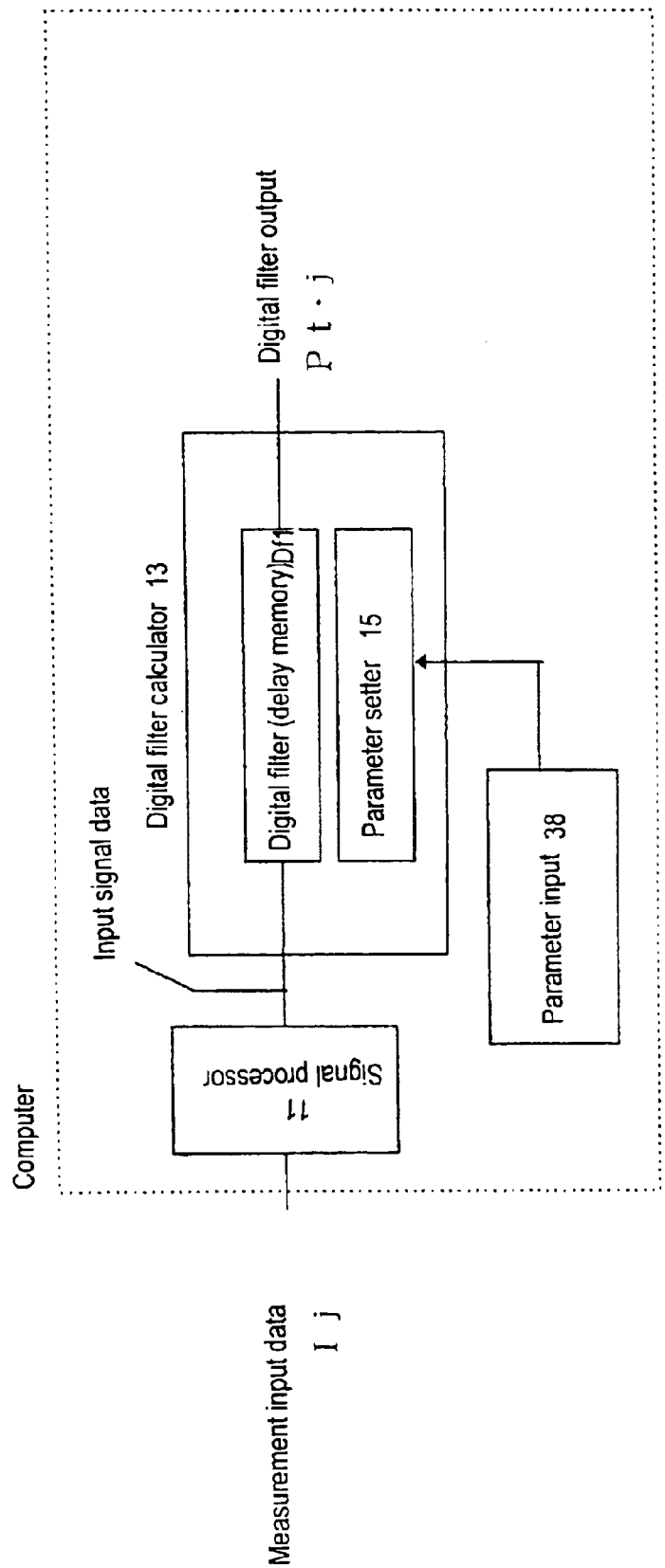
FIG. 33 is a block diagram showing a digital filter function comprising another digital filter calculator.

FIG. 33 illustrates the basic system of performing 1/f fluctuation conversion using digital filters Dfs of a waveform detection system 10. FIG. 33 shows a method for detecting waveforms using the computer 9 incorporated in the waveform detection system shown in FIG. 1. The digital filter Df shown in FIG. 33 is not essential to the synthesizer 17 shown in FIG. 1. The multiplication coefficient patterns for digital filters Dfs are set by the parameter setter 15. It is also possible to set multiplication coefficient patterns that are transferred externally via parameter input 38.

Figure 34:
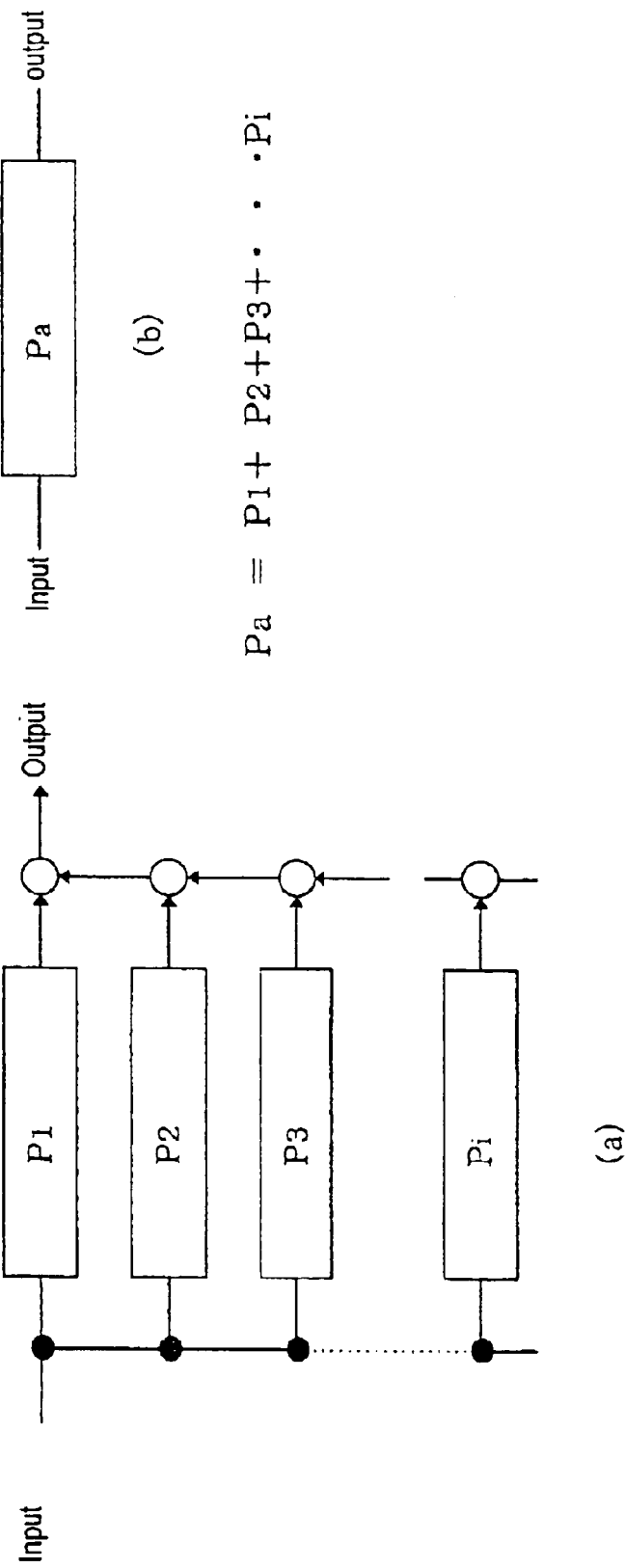
FIG. 34 is a block diagram showing a structure of a digital filter function comprising another digital filter calculator.

FIG. 33 shows the digital filter function comprising a digital filter calculator 13. The digital filter function used is the same as that described above in FIG. 3A. FIG. 34 is a conceptual drawing for FIG. 33. Pa in FIG. 34 represents digital filters DFs and is calculated using the following equation:

$$Pa = P1 + P2 + P3 + \ldots + Pi \qquad (6)$$

Pi in FIG. 34 is the multiplication coefficient pattern that is set for the individual digital filters Dfs. The multiplication coefficient pattern is calculated using the above equation.

The output waveforms derived from synthesizing the outputs of the individual digital filters Dfs shown in FIG. 34 are identical with the output waveforms of the digital filter Df with multiplication coefficient pattern Pa shown in FIG. 34. It is possible to develop multiplication coefficient patterns for 1/f fluctuation filters using the above waveform converter by means of procedures other than those disclosed in the present, invention. To be specific two or more digital filters Dfs, each of which has an elemental pattern, are combined and their outputs synthesized, or alternatively, elemental patterns are combined to generate a new multiplication coefficient pattern. In the latter case, since any multiplication coefficient pattern setting parameters must be set to generate a filter, and it is time-consuming for the operator to generate a filter pattern.

The elemental pattern development procedure using the present invention requires setting of only two parameters; the number of digital filter taps L and the number of integration n using the above formulas. The merits are:

a. The parameters to be controlled in setting a multiplication coefficient pattern are few so that trials and errors are reduced.

b. The shape of a digital filter is uniquely defined by the number of integration n, so that it is easy for the operator to estimate and determine the shape or filter characteristics.

Figure 35A:
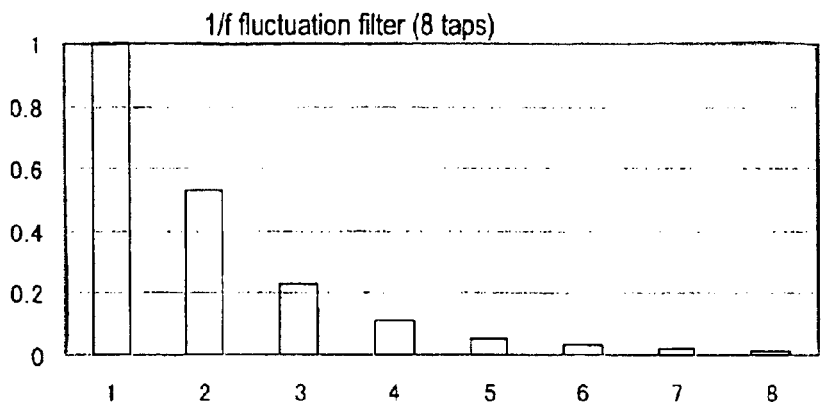
FIGS. 35A–35C are multiplication coefficient pattern synthesized using these elemental patterns (FIG. 35A), and relevant conversion output diagrams (FIGS. 35B and 35C)
Figure 35B:
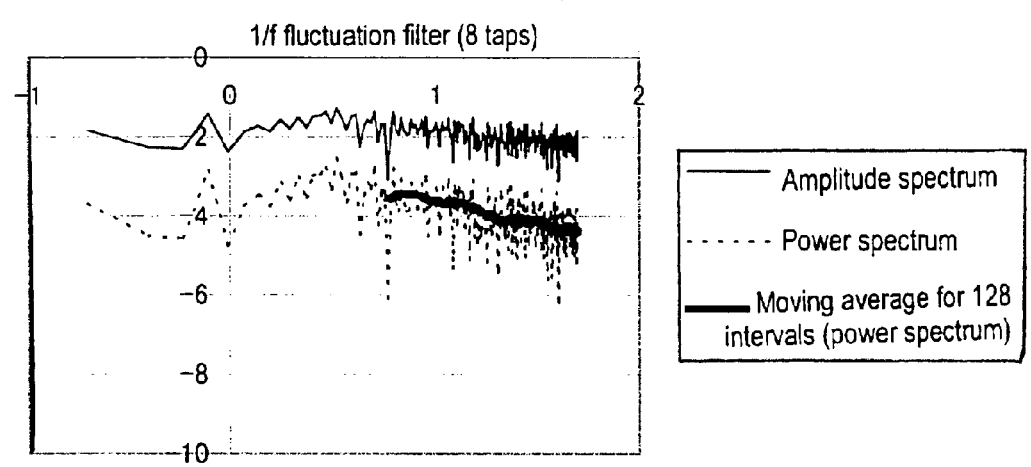
Figure 35C:
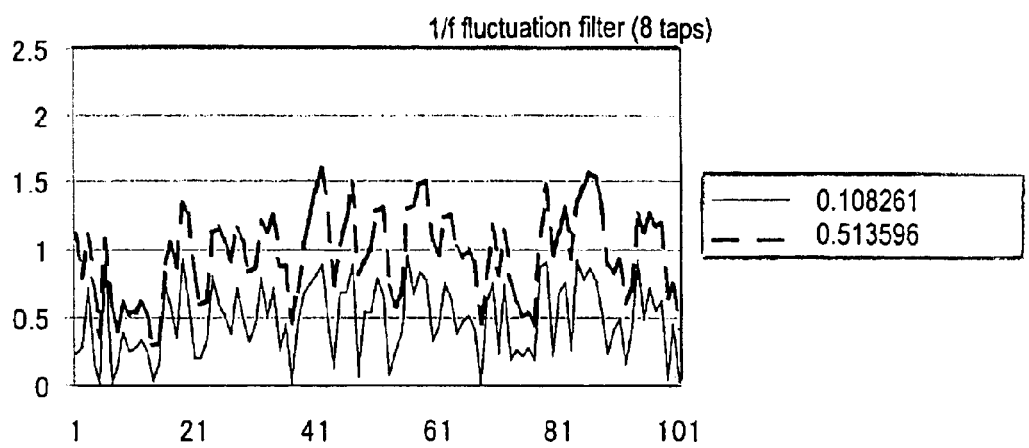
Figure 44A:
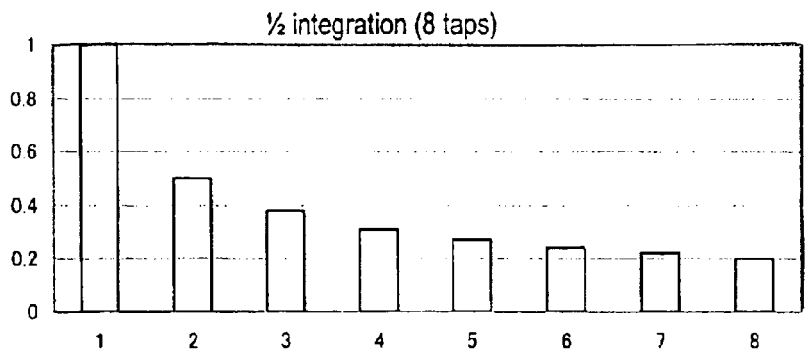
FIGS. 44A–44C are graphs showing multiplication coefficient patterns of ½-time integration with 8-tap digital filters (FIG. 44A), and the relevant conversion output diagrams (FIGS. 44B and 44C)
Figure 44B:
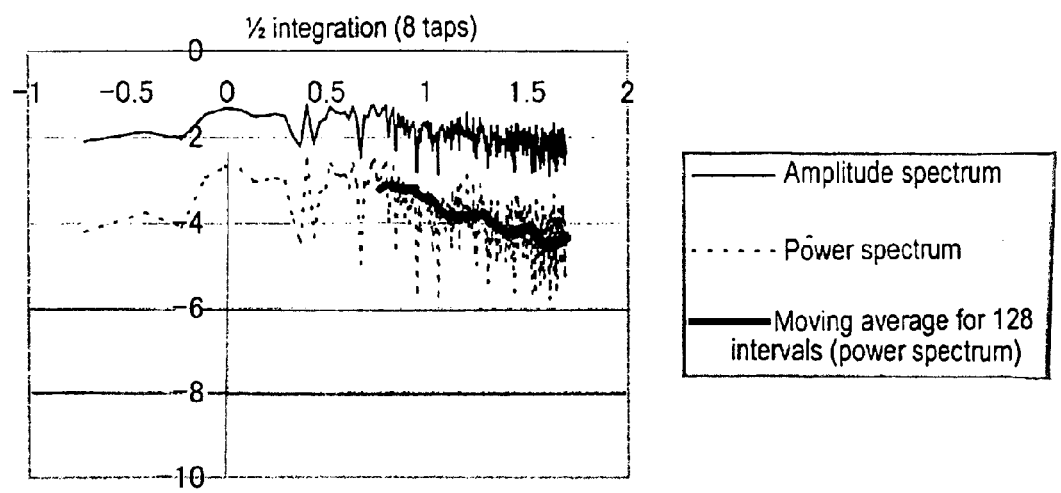
Figure 44C:
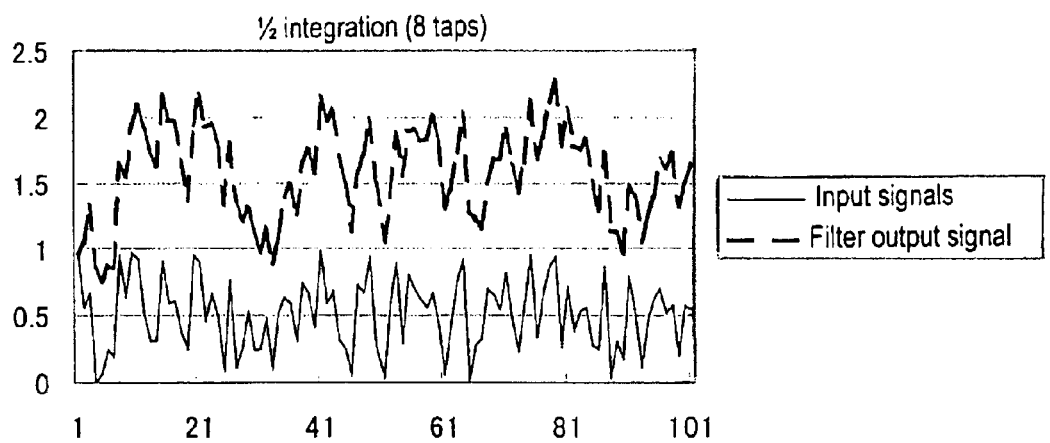
Figure 45A:
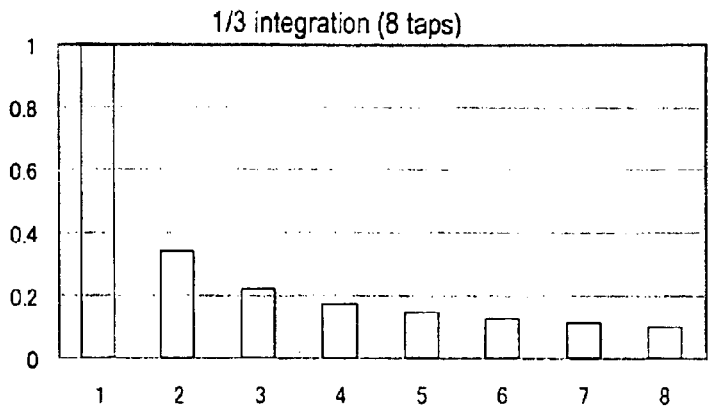
Figure 45B:
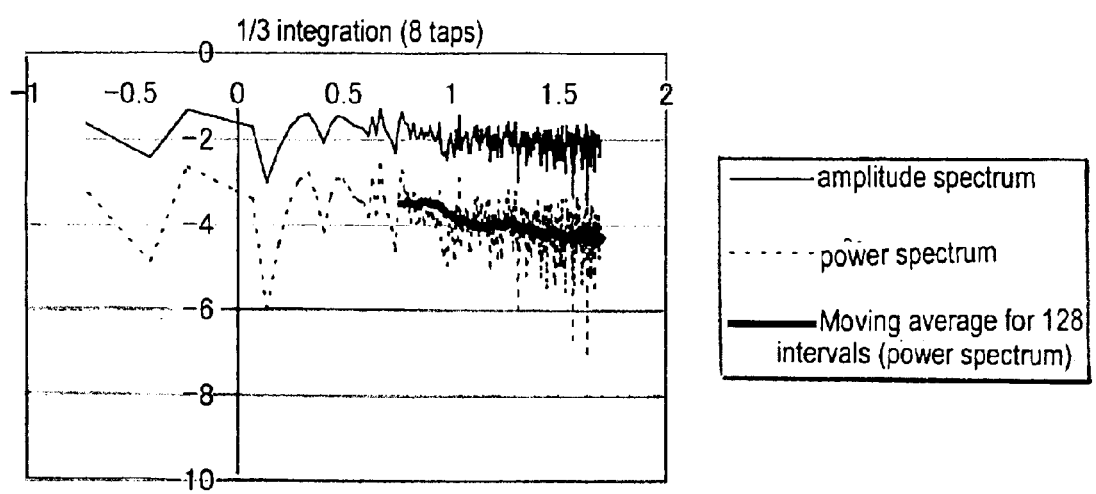
Figure 45C:
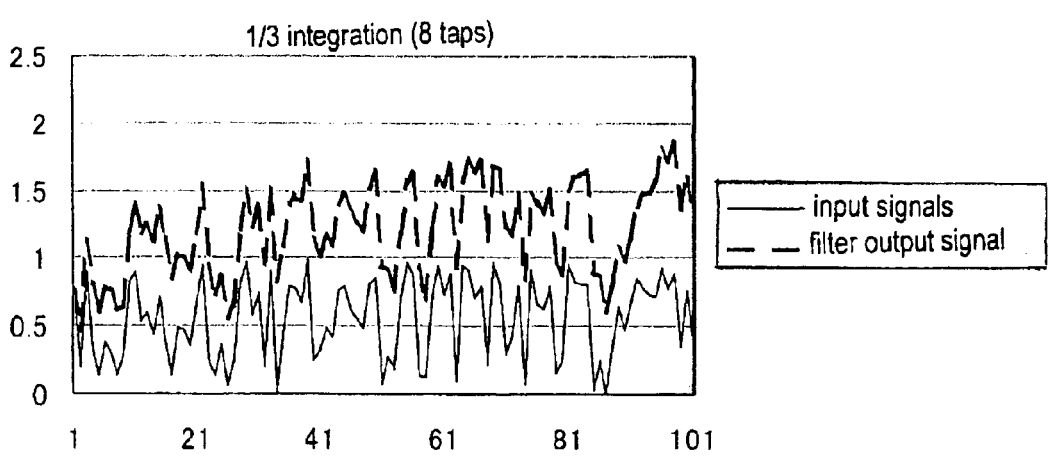

FIG. 35A shows a synthesized multiplication coefficient pattern from elemental patterns. FIG. 35B is a power spectrum diagram derived from a digital filter featuring the synthesized pattern. Comparing this power spectrum diagram with the conventional one shown in FIG. 44, we know that the tilt of power spectrum shown in FIG. 35B is smoother than the conventional one, or −1, which indicates that the tilt is closest to the tilt of 1/f fluctuation.

As described above, with the waveform detection system of the present invention, the shape of the multiplication coefficient pattern of digital filters is designed to maximize the phase characteristic ability to perceive undulation and other anomalies) by sacrificing frequency separation characteristics that are the basic concept of conventional wavelet systems. With the system of the present invention, the phase delay (gap of detection time) of multiple filters is determined at the same time. For these reasons, the waveform detection system of the present invention characterizes a wide range of waveforms from pulse sounds containing sharp and high-frequency components to very long cyclic time-series data with little change recurring slowly over a long time period. The system also easily outputs specific waveforms such as 1/f fluctuation waveform. The above working example uses computers in the same way that conventional wavelet-type operations do. It is possible to configure the system by combining pieces of hardware with respective functions. The above-mentioned embodiment is only an example, and the present invention may be implemented in various other forms of embodiment without deviating from the spirit and essential features thereof.

INDUSTRIAL APPLICATION

As described above in detail, the present invention provides improved high-speed response over conventional wavelet systems and the unit is more compact because the waveform detection system is embedded in sensor amplifiers or monitors. It is easy to detect low frequencies, undulation, and sharp pulses, and it also easily generates multiplication coefficient patterns. For these reasons, the system of the present invention can be easily adapted to various systems.

It also exhibits excellent effects such as ease of outputting specific waveforms such as 1/f fluctuation waveforms.

What is claimed is:

1. A waveform detection system comprising:

a sensor, a signal input, a computer to characterize signal data based on signals output from the signal input, a determinator to determine the characteristics of waveforms based on the output of the computer, and an output to show the result of determination of the determinator, wherein the computer has a digital filter calculator, a phase matching parameter setter, and a synthesizer; the digital filter calculator has digital filters each equipped with a delay memory to store and delay input signals and a multiplication coefficient pattern memory to store multiplication coefficient patterns, and a parameter setter; the parameter setter has a multiplication coefficient pattern setter to set multiplication coefficient pattern and a filter parameter setter; the digital filter calculator connects signal data input from the signal input to the digital filters, calculating and outputting the sum of products for the contents of both memories; the outputs of the digital filter calculator are merged at the synthesizer, and signs of state change are characterized based on the synthesized output, wherein, furthermore, multiple digital filters are installed at the digital filter calculator in the computer; the coefficient patterns derived from non-integer n-time integration are used as elemental multiplication coefficient patterns; a means is provided to change the phase of at least one of the elemental patterns, input signal data, and digital filter output (phase-matching parameter setter); and the outputs of digital filters that use the elemental patterns are synthesized in a state where a portion of the phases of the characteristic extracting and processing function is changed.

2. A waveform detection system as claimed in claim 1 wherein a phase memory to delay input or output of the digital filter for a certain time period is installed; the phase matching parameter setter is used to set a delay time such that the phase of the output matches the phase of other digital filters; and the outputs from digital filters are synthesized and transferred to the determinator.

3. A waveform detection system as claimed in claim 2 wherein the maximum or minimum output of the digital filter is temporarily stored in the phase memory, and the outputs of multiple digital filters are synthesized for determination.

4. A waveform detection system as claimed in claim 3 wherein a determinator function to determine output values is provided on the output of digital filters; the values are temporarily stored in the phase memory; and the phases of the result of determination are matched before deriving a synthesized output.

5. A waveform detection system as claimed in claim 1 wherein in place of matching phases such as by delaying input or output of digital filters using the phase changing means (phase-matching parameter setter) of the computer the parameters are transferred from the phase-matching parameter setter to the multiplication coefficient pattern setter of the parameter setter, to change the phase of multiplication coefficient patterns, and a new multiplication coefficient pattern is generated by synthesizing the multiple multiplication coefficient patterns and setting them to the digital filters.

6. A waveform detection system comprising: a computer that characterizes signal data and a parameter input, wherein the computer has a digital filter calculator and a parameter input; the digital filter calculator has digital filters each equipped with a delay memory to store and delay input signals and a multiplication coefficient pattern memory to store multiplication coefficient patterns, and a parameter setter; the parameter setter has a multiplication coefficient pattern setter to set multiplication coefficient pattern via a parameter input and a filter parameter setter; the digital filter calculator connects signal data input from the input to the digital filters, calculating and outputting the sum of products for the contents of both memories; the multiplication coefficient patterns are so made as to have a simply decreasing or simply increasing tilt; and the output of the digital filter calculator is a conversion output, wherein, furthermore, the multiplication coefficient patterns are elemental multiplication coefficient patterns derived from non-integer n-time integration; and the digital filter output is adjustable using the number of integration n such that the power spectrum tilt of the frequency response is 1 or −1 in a portion of the frequency band.

7. A waveform detection system as claimed in claim 6 wherein elemental pattern 1 is selected from the multiplication coefficient pattern; a similar elemental pattern 2 of the opposite sign to pattern 1 is selected from the multiplication coefficient pattern; elemental patterns 1 and 2 are positioned with their leads staggered; the values of coefficients on the same position are added to generate a new multiplication coefficient pattern; and the new pattern is applied to the above digital filter so that the tilt of the power spectrum relative to the input signal (frequency response of output signal) is 2 (f2-power fluctuation conversion).

8. A waveform detection system as claimed in claim 7 wherein a coefficient pattern derived from the above non-integer n-time integration and the multiplication coefficient pattern making up the above f2-power fluctuation conversion are added to generate a new multiplication coefficient pattern; and the new pattern is applied to the above digital filter so that the tilt of power spectrum of output signals relative to the input signal is 1 (f fluctuation conversion) and the value of the output predicts the value of an upcoming input.

9. A waveform detection system as claimed in claim 7 or 8 wherein correction is made so that the zero-approaching end of the multiplication coefficient pattern will approach zero gradually in order to prevent bias damping intrinsic to digital information processing.

10. A state-monitoring system incorporating a waveform detection system as claimed in any of claims 1 through 8 wherein the characteristics of the waveforms determined by the determinator are extracted from signal data transferred from the signal input to the computer, wherein the characterized waveforms are used to determine the state of input signals and the result of the determination is displayed.

11. A state-monitoring system incorporating a waveform detection system as claimed in claim 9 wherein the characteristics of the waveforms determined by the determinator are extracted from signal data transferred from the signal input to the computer, wherein the characterized waveforms are used to determine the state of input signals and the result of the determination is displayed.

* * * * *